(12) United States Patent
Jones et al.

(10) Patent No.: US 9,035,790 B2
(45) Date of Patent: May 19, 2015

(54) WIRELESS POWER TRANSFER ELECTRIC VEHICLE SUPPLY EQUIPMENT INSTALLATION AND VALIDATION TOOL

(75) Inventors: Perry T. Jones, Knoxville, TN (US); John M. Miller, Oak Ridge, TN (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 401 days.

(21) Appl. No.: 13/526,659

(22) Filed: Jun. 19, 2012

(65) Prior Publication Data
US 2013/0021168 A1   Jan. 24, 2013

Related U.S. Application Data

(60) Provisional application No. 61/510,210, filed on Jul. 21, 2011, provisional application No. 61/510,231, filed on Jul. 21, 2011.

(51) Int. Cl.
| | |
|---|---|
| *G08B 23/00* | (2006.01) |
| *G08C 15/06* | (2006.01) |
| *G01R 33/00* | (2006.01) |
| *G01R 31/00* | (2006.01) |

(52) U.S. Cl.
CPC .............. *G01R 33/00* (2013.01); *G01R 31/00* (2013.01)

(58) Field of Classification Search
USPC .......... 340/870.02, 657, 691.1; 324/537, 226, 324/66; 307/45, 104, 17, 38
See application file for complete search history.

(56) References Cited

U.S. PATENT DOCUMENTS

2007/0228833 A1\* 10/2007 Stevens et al. .................. 307/45
2008/0238364 A1   10/2008 Weber et al.

FOREIGN PATENT DOCUMENTS

| WO | 2005/109597 A1 | 11/2005 |
| WO | 2008/114268 A2 | 9/2008 |
| WO | WO 2008114268 A2 \* | 9/2008 |

OTHER PUBLICATIONS

International Search Report and Written Opinion dated Oct. 4, 2012, issued in International Application No. PCT/US2012/043095.

\* cited by examiner

*Primary Examiner* — Hoi Lau
(74) *Attorney, Agent, or Firm* — Scully, Scott, Murphy & Presser, P.C.

(57) ABSTRACT

A transmit pad inspection device includes a magnetic coupling device, which includes an inductive circuit that is configured to magnetically couple to a primary circuit of a charging device in a transmit pad through an alternating current (AC) magnetic field. The inductive circuit functions as a secondary circuit for a set of magnetically coupled coils. The magnetic coupling device further includes a rectification circuit, and includes a controllable load bank or is configured to be connected to an external controllable load back. The transmit pad inspection device is configured to determine the efficiency of power transfer under various coupling conditions. In addition, the transmit pad inspection device can be configured to measure residual magnetic field and the frequency of the input current, and to determine whether the charging device has been installed properly.

18 Claims, 19 Drawing Sheets

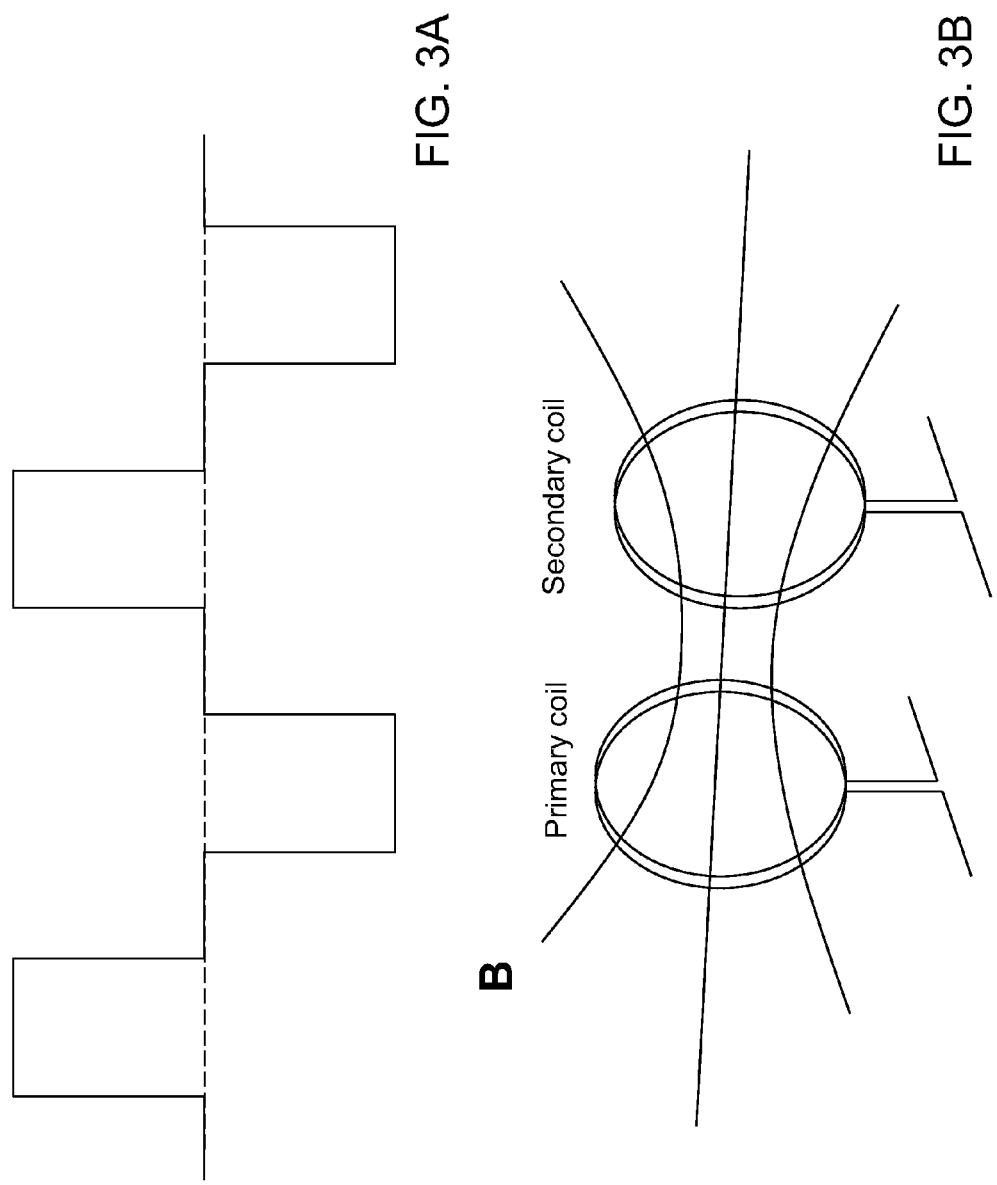

WIRELESS POWER TRANSFER ELECTRIC VEHICLE SUPPLY EQUIPMENT INSTALLATION AND VALIDATION TOOL

CROSS-REFERENCE TO RELATED APPLICATIONS

This application claims the benefit of priority from U.S. provisional application No. 61/510,210, filed on Jul. 21, 2011, and from U.S. provisional application No. 61/510,231, filed on Jul. 21, 2011, the contents of which are incorporated herein by reference.

STATEMENT REGARDING FEDERALLY SPONSORED RESEARCH OR DEVELOPMENT

This invention was made with United States government support under Prime Contract No. DE-AC05-00OR22725 awarded by the U.S. Department of Energy. The United States government has certain rights in this invention.

FIELD OF THE INVENTION

The present invention relates to the field of wireless power transfer, and particularly to installation and validation tools for wireless power transfer electric vehicle supply equipment (EVSE).

BACKGROUND OF THE INVENTION

Wireless power transfer can be employed to charge a plug-in electric vehicle (PEV) without physical contact between a charging device and the PEV. Charging stations can be installed to provider wireless power transfer to such PEV's. However, excessive level of residual magnetic field generated by charging devices at a charging station can be hazardous to people and pets. Further, improperly installed charging stations can cause unacceptably high level of wasted power during charging. In addition, improper installation of charging stations can cause excessive unwanted heating of materials, and in extreme cases, can cause fire through heat. Thus, it is necessary that charging devices and facilities at charging stations be properly installed in order to provide safe and efficient operation of such charging stations.

SUMMARY OF THE INVENTION

A transmit pad inspection device includes a magnetic coupling device, which includes an inductive circuit that is configured to magnetically couple to a primary circuit of a charging device in a transmit pad through an alternating current (AC) magnetic field. The inductive circuit functions as a secondary circuit for a set of magnetically coupled coils. The magnetic coupling device further includes a rectification circuit, and includes a controllable load bank or is configured to be connected to an external controllable load bank. The transmit pad inspection device can be configured to be in communication with a utility feed smart meter through a bidirectional communication, and to receive information on the total input power provided through the utility feed smart meter. Further, the transmit pad inspection device can be configured to calculate the output power delivered to the controllable load bank, and to determine the efficiency of power transfer under various coupling conditions. In addition, the transmit pad inspection device can be configured to measure residual magnetic field and the frequency of the input current, and to determine whether the charging device has been installed properly.

According to an aspect of the present disclosure, a transmit pad inspection device is provided, which includes: a magnetic coupling device including an inductive circuit that is configured to magnetically couple to a primary circuit of a charging device in a transmit pad as a secondary circuit through an alternating current (AC) magnetic field; a controllable load bank connected to the magnetic coupling device; a means for determining an input power applied to the primary circuit through communication with a device configured to measure the input power; and a means for determining an output power delivered to a load in the controllable load bank.

According to another aspect of the present disclosure, a method of inspecting a transmit pad for wireless power transfer is provided. The method includes: providing a transmit pad inspection device including a magnetic coupling device including an inductive circuit and a controllable load bank connected to the magnetic coupling device; positioning the magnetic coupling device in a vicinity of a transmit pad of a charging device that includes a primary circuit, wherein the vicinity is selected to magnetically couple the inductive circuit to the primary circuit through an alternating current (AC) magnetic field generated by the primary circuit; determining an input power applied to the primary circuit; and determining an output power delivered to a load in the controllable load bank.

BRIEF DESCRIPTION OF THE DRAWINGS

FIG. 3A is a schematic waveform of an alternating current (AC) output voltage of a grid converter according to an embodiment of the present disclosure.

FIG. 3B is a schematic diagram illustrating coupling of a magnetic field between a primary coil and a secondary coil according to an embodiment of the present disclosure.

DETAILED DESCRIPTION OF THE INVENTION

As stated above, the present invention relates to installation and validation tools for wireless power transfer electric vehicle supply equipment (EVSE), which is now described in detail with accompanying figures. The drawings are not drawn to scale.

As used herein, a "grid converter" herein refers to a device that takes alternating current (AC) supply voltage having a frequency less than 1 kHz and generated alternating current (AC) supply voltage having a frequency greater than 1 kHz.

To address the requirement of interoperability for wireless power transfer (WPT), global standardization of WPT operating frequency, coupling coil dimensions and locations on both parking space and vehicle, and the treatment of misalignment between the vehicle mounted receiver coil and the floor mounted (on or embedded in) transmit coil can be employed. For example, SAE J2954 Wireless Charging Task Force has the charter to develop such standards, safety and emissions, and bidirectional communications.

The requirement of safety is inherently satisfied in WPT because the magnetic transfer eliminates the need for vehicle leakage current detection and minimization to prevent shock hazard. This minimizes the need for galvanic isolation of the WPT charging system components so that the power delivered may be taken directly to the vehicle battery pack. However, safety also involves magnetic and electric field emissions and these are already covered by international standards such as ICNIRP and ARPANSA.

Figure 1A:
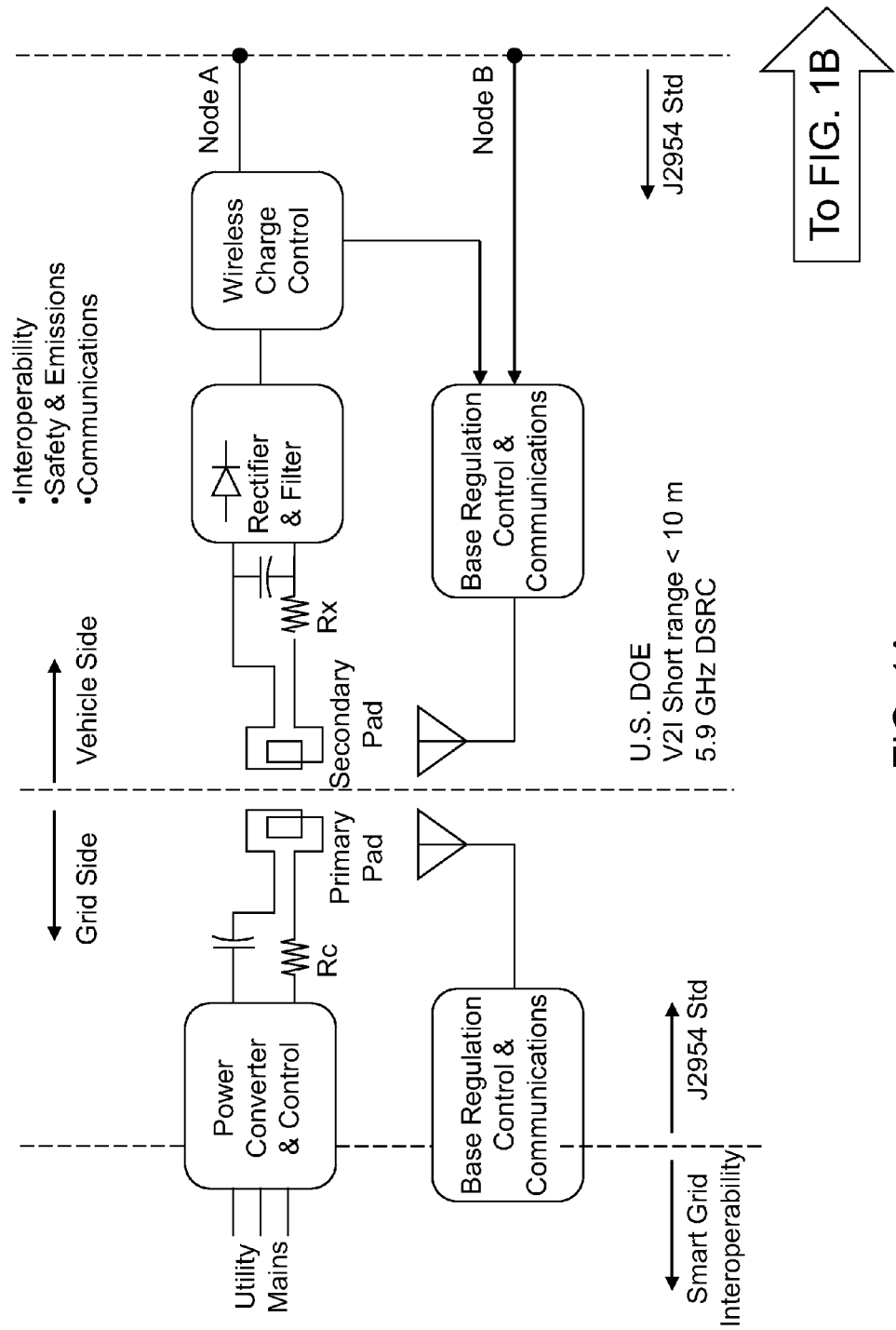
FIGS. 1A and 1B show a functional diagram of an exemplary wireless power transfer system according to an embodiment of the present disclosure.
Figure 1B:
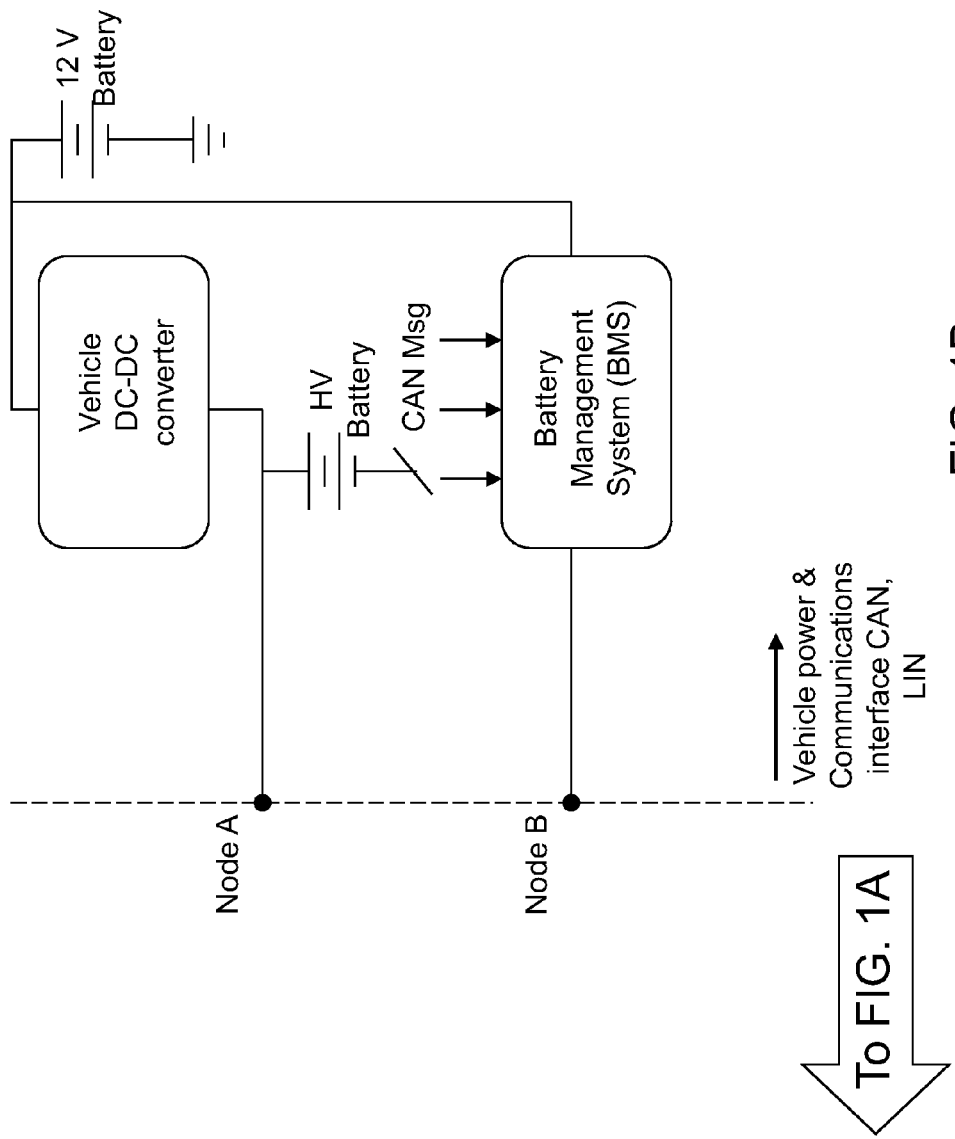

The requirement of bidirectional communications can be satisfied employing vehicle to infrastructure (V2I) communications for the purpose of communicating vehicle location relative to the charging pad, activation signals and regenerative energy storage system (RESS) state-of-charge (SOC), state-of-health (SOH) if needed, charge rate, temperatures, voltage, etc to the grid connected power inverter. The grid converter on the other hand may initiate power transfer by communicating with the vehicle to insure proper location relative to the transmit pad, all clear signals that no obstacles or biologics are present in the active zone and utility rate and time of use (TOU) data for most economic charging. As used herein, an active zone refers to a zone in which the magnetic field induced by the primary coil in the transmit pad (primary pad) is high enough to include substantial induction current if an induction coil of a secondary circuit is placed therein. A transition zone refers to a zone in which the magnitude of the magnetic field is not strong enough to cause significant power transfer through inductive coupling, but is above a level that is deemed to be environmentally safe, e.g., 6.25 µT. A public zone refers to a zone in which the magnitude of the magnetic field is supposed to be within an environmentally safe level, e.g., less than 6.25 µT. Coil to coil location, all clear signal, activate signal, power level and inhibit signals can be employed to provide proper energy management between the WPT charger and the vehicle RESS. The functional diagram in FIGS. 1A and 1B illustrates the overall scheme for energy management and RESS pack regulation needed in WPT.

In the functional diagram of FIG. 1, the grid connected power converter is connected to an appropriate utility service such as a 240 $V_{ac}$, single phase line for level 2 power feed at 3 kW to 7 kW. As used herein, $V_{ac}$ refers to an alternating current voltage, and $V_{dc}$ refers to a direct current voltage. For higher power levels such as direct current (DC) fast charge level 2 (40 kW to 70 kW) or DC fast charge level 3 (>70 kW and up to 250 kW or higher), a 480 $V_{ac}$ and 3-phase connection, or higher voltage such as direct connection to medium voltage distribution line (2.4 kV to 11 kV) can be employed. Once such a power supply is provided, it is feasible to use such high power WPT for commercial applications such as shuttles, trolleys, and transit bus wireless charging. Rectified mains voltage, $U_d$, is processed by a power converter and control module to a controlled duty ratio quasi-square wave at the specified operating frequency as the means to regulate the power delivery.

Resonant magnetic coupling provides a coupling between a primary circuit located on the grid side, i.e., on a charging facility, and a secondary circuit located on a vehicle side, i.e., within a vehicle. Specifically, resonant magnetic coupling provides the non-contacting power transfer medium from a primary coil of the primary circuit located in a primary pad to a vehicle mounted receiver coil, i.e., a secondary coil of the secondary circuit located in a secondary pad that is mounted to the vehicle.

A rectifier and filter module converts the alternating current induced in the secondary coil into a direct current voltage, which applied to a high voltage (HV) battery through a wireless charge control module. A battery management system (BMS) monitors the state of the HV battery, and provides information to a component, within the vehicle, of a base regulation control and communications module. The HV battery can be configured to provide a DC voltage, for example, in a range from 100V to 1 kV. A vehicle DC-DC converter can be employed to charge a 12 V battery within the vehicle to supply ancillary loads.

Figure 2:
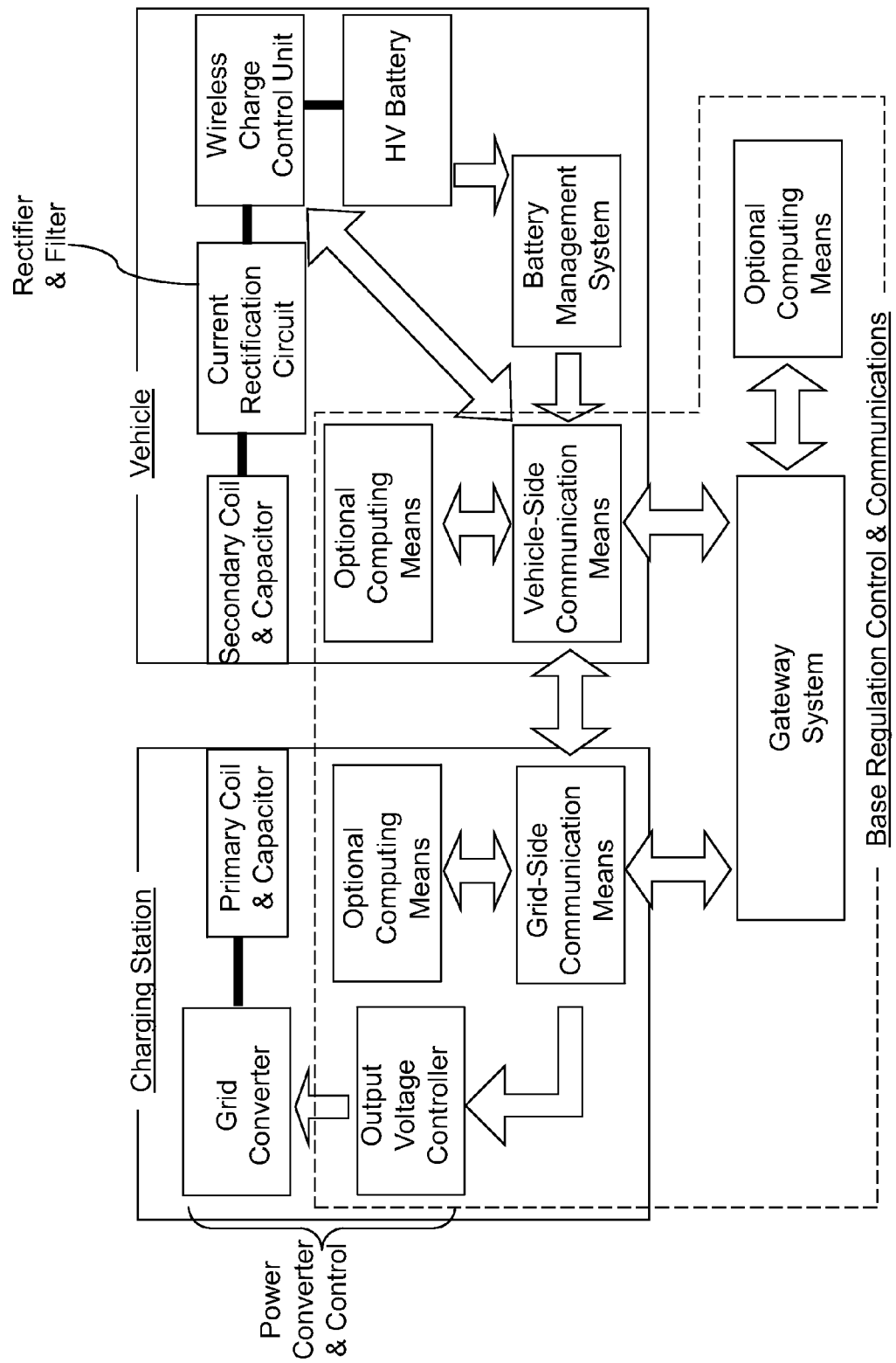
FIG. 2 shows a schematic of a portion of the exemplary wireless power transfer system of FIGS. 1A and 1B according to an embodiment of the present disclosure.

Referring to FIG. 2, a portion of the exemplary wireless power transfer system of FIGS. 1A and 1B is schematically illustrated. The system includes a charging station, a vehicle, and an optional gateway system, and an optional computing means in communication with the gateway system. The charging station includes the primary circuit, which includes the grid converter and the primary coil. The vehicle includes the secondary circuit, which includes the secondary coil, the current rectification circuit, a wireless charge control unit, and a high voltage (HV) battery. The total impedance of the current rectification circuit, the wireless charge control unit, and the HV battery as seen by the combination of the secondary coil and a parallel tuning capacitor of the secondary circuit is herein referred to as the load of the secondary circuit.

The primary circuit includes a grid converter and a primary coil located in a primary pad. The secondary circuit is located in the vehicle and includes a secondary coil, a parallel tuning capacitor, a current rectification circuit connected to the secondary coil, and a battery connected to the current rectification circuit. The vehicle further includes a battery management system configured to measure at least one parameter of the battery, and a vehicle-side communication means configured to transmit information on the at least one parameter of the battery. The at least one parameter is a measure of an effective resistance of the battery as seen by the primary circuit. The charging station can further include an output voltage controller configured to control an alternating current (AC) output voltage of the grid converter based on information derived from the at least one parameter of the battery.

In one embodiment, the AC output voltage can be a quasi-square wave or a square wave, and has a duty ratio in a range from, and including, 0 to, and including, 1. The output voltage controller can be configured to control at least one of a duty cycle of the AC output voltage, a frequency of the AC output voltage, and a magnitude of the AC output voltage. Additionally or alternately, the output voltage controller can be configured to control a duty cycle of the AC output voltage, a frequency of the AC output voltage, and a magnitude of the AC output voltage.

In one embodiment, the at least one parameter of the battery measured by the battery management system can include at least one of temperature of the battery, a voltage level of the battery, and state of charge of the battery. In one embodiment, the at least one parameter of the battery measured by the battery management system can include the temperature of the battery, voltage level of the battery, and state of charge of the battery. Additionally or alternately, the at least one parameter of the battery measured by the battery management system can include the charge rate of the HV battery.

In one embodiment, the at least one parameter of the battery measured by the battery management system can include a parameter that is identical to, or is linearly proportional to, the effective resistance of the battery as seen by the primary circuit.

Optionally, a gateway system can be provided. The gateway system can be configured to receive information on the at least one parameter of the battery as transmitted by the vehicle-side communication means, and can be configured to transmit the information derived from the at least one parameter, directly or indirectly, to the output voltage controller. In one embodiment, the gateway system can employ internet.

In one embodiment, a grid-side communication means can be provided. The grid-side communication means can be configured to receive the information derived from the at least one parameter, and can be configured to relay the information derived from the at least one parameter to the output voltage controller.

In one embodiment, the information derived from the at least one parameter of the battery includes a target value for each of one or more waveform parameters of the AC output voltage of the grid converter. In one embodiment, a computation means configured to generate the one or more target values from the at least one parameter of the battery can be provided within the vehicle, within the charging station, or outside the vehicle and outside the charging station as an independent unit. The computing means is in communication with at least one of a vehicle-side communication means provided within the vehicle, a grid-side communication means provided within the charging station, or with the gateway system. The vehicle-side communication means, the grid-side communication means, the computing means, the output voltage controller for the grid converter, and the optional gateway system collectively constitute a base regulation control and communications system.

In one embodiment, the gateway system can be configured to receive information on the at least one parameter of the battery as transmitted by the vehicle-side communication means, and can be configured to transmit the one or more target values for each of one or more waveform parameters of the AC output voltage of the grid converter, directly or indirectly, to the output voltage controller. The computation means can be in communication with the gateway system.

In one embodiment, the computation means can be located within the vehicle and can be in communication with the battery management system and the vehicle-side communication means. The information on the at least one parameter of the battery as transmitted by the vehicle-side communication means can include the one or more target values for each of one or more waveform parameters of the AC output voltage of the grid converter.

In one embodiment, the computation means can be located within a facility that houses the grid converter, i.e., within the charging station. The computation means can be in communication with the vehicle-side communication means directly or indirectly, and the one or more target values for each of one or more waveform parameters of the AC output voltage of the grid converter can be provided to the grid converter.

In one embodiment, the one or more target values for each of one or more waveform parameters of the AC output voltage of the grid converter can include a target frequency for the AC output voltage. Additionally or alternately, the one or more target values for each of one or more waveform parameters of the AC output voltage of the grid converter can include a target magnitude for the AC output voltage. Additionally or alternately, the one or more target values for each of one or more waveform parameters of the AC output voltage of the grid converter can include a target value for a parameter that controls a magnitude of a fundamental component of the AC output voltage.

In one embodiment, the at least one parameter of the battery that the battery management system measures can include the temperature of the battery and the state of charge (SOC) of the HV battery. As used herein, the state of charge of the battery refers to the ratio of the energy stored in a battery ($Wh_x$) to the total (100% SOC) energy storage capacity of the battery ($Wh_{100}$). The computation means can be configured to determine a charge rate of the battery from the temperature of the battery and the SOC of the battery.

In one embodiment, the at least one parameter of the battery that the battery management system measures can further include a voltage level of the battery. The computation means can be configured to determine the effective resistance of the battery as seen by the primary circuit. Further, the computation means can be configured to determine an input impedance of the secondary circuit as seen by the primary circuit. In addition, the computation means can be configured to determine a frequency at which an imaginary component of input impedance of a circuit including the primary circuit and incorporating the input impedance of the secondary circuit becomes zero.

The primary pad housing the primary coil can be located in any place that a vehicle can be placed proximately to. In one embodiment, the primary coil can be located within a facility configured to park or store vehicles. In another embodiment, the primary coil can be located underneath, or over, a road configured to allow vehicles to pass through. In yet another embodiment, the primary coil can be located within a structure located on a side of a road configured to allow vehicles to pass through.

In a non-limiting exemplary embodiment, the output voltage controller and the grid-side communications means can be embodied in a grid converter V2I communications and regulation control unit. The grid converter V2I communications and regulation control unit can receive, directly or indirectly from the vehicle, dedicated short range communications (DSRC) message for charge level and frequency offset needed for energy management of the regenerative energy storage system (RESS) pack.

The base regulation control and communications function interprets the DSRC message as a command for grid converter duty ration d* and frequency offset f*. The grid converter duty ratio d* provided to the grid converter regulates WPT power level by adjusting the fundamental component, $U_1(t)$, applied to the series resonant primary of the coupling coil assembly. In this expression $T_1=1/f$, and f represents the operating frequency of WPT (when standardized: 10 kHz<f<140 kHz), and pulse time τ is given by $d*T_1/2$.

Figure 3C:
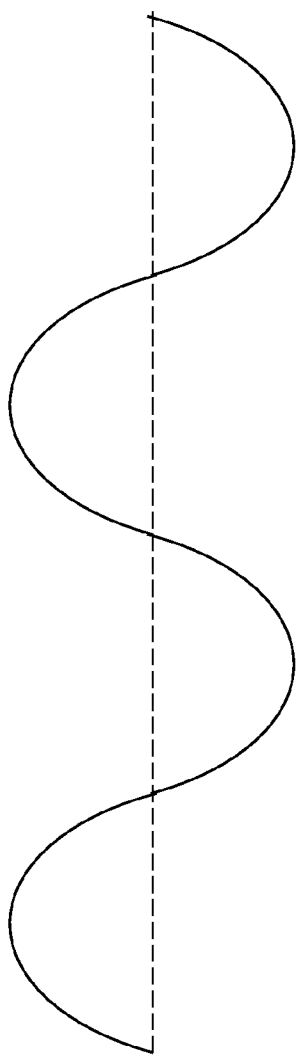
FIG. 3C is a schematic waveform of a secondary current through the secondary coil according to an embodiment of the present disclosure.
Figure 3D:
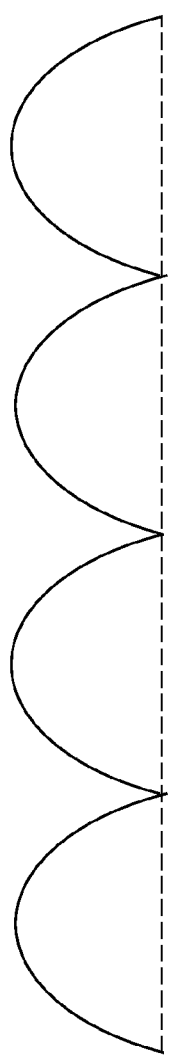
FIG. 3D is a schematic waveform of a rectified current according to an embodiment of the present disclosure.
Figure 3E:
FIG. 3E is a schematic waveform of an ideal direct current (DC) voltage applied across a battery to be charged according to an embodiment of the present disclosure.

Wireless charge coupling coil transmission of the power generated by the grid converter as quasi-square wave voltage to a rectified direct current voltage is illustrated in FIGS. 3A-3E. The quasi-square wave voltage generated by the grid converter can have the waveform illustrated in FIG. 3A. The magnetic coupling between the primary coil and the secondary coil of the magnetic field B as illustrated in FIG. 3B induces a nearly sinusoidal secondary current through the secondary coil of the secondary circuit as illustrated in FIG. 3C. The nearly sinusoidal current is rectified to provide an input voltage as illustrated in FIG. 3D. The receiver WPT coil output, after rectification, is applied to a filter to smooth the high frequency AC ripple prior to injection into the battery pack (assumed to be lithium-ion) of the HV battery. The voltage applied to the HV battery is schematically illustrated in FIG. 3E. The dotted lines in FIGS. 3A, 3C, 3D, and 3E refer to electrical ground, i.e., the voltage of 0 V.

In one embodiment, signals from the battery management system (BMS) and supporting messages from the vehicle CAN network can be routed via the vehicle regulation control and DSRC communications to the grid controller to manage RESS charging. In one embodiment, the EMS signals can include the RESS pack SOC and the temperature, which can be employed to determine the grid converter duty ratio d*. Coupling coil spacing, alignment and RESS charge rate necessitate an additional control signal for frequency offset f*.

Figure 4:
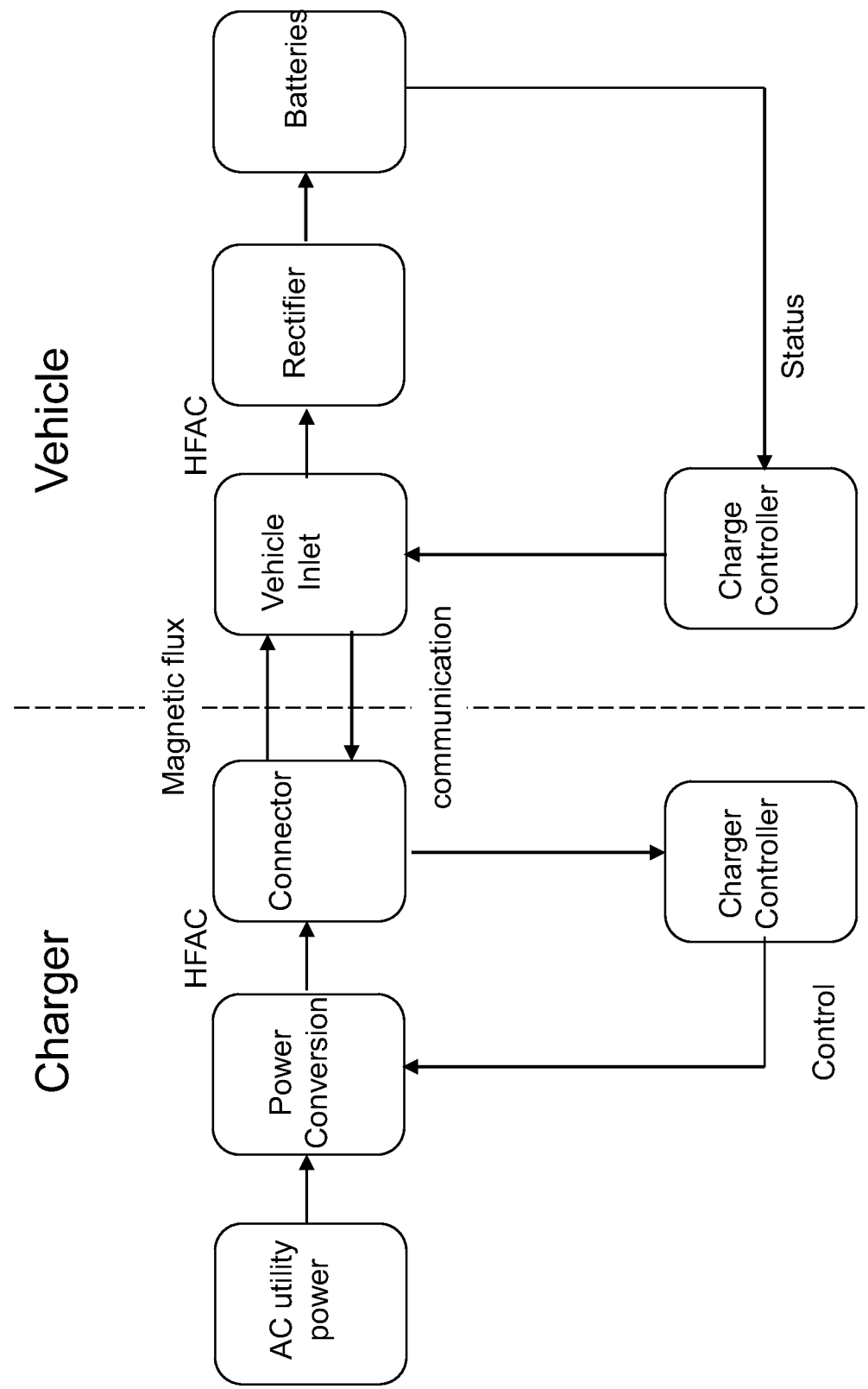
FIG. 4 is a high level functional diagram for the WPT illustrating various modules of an exemplary wireless power transfer system according to an embodiment of the present disclosure.

FIG. 4 is a high level functional diagram for the WPT. The functional diagram of FIG. 4 highlights the major elements of wireless power transmission. The power flow path includes the magnetic flux that passes through the coupling coils, i.e., the primary coil and the secondary coil.

In one embodiment, the communications channel can adhere to U.S. department of transportation (DOT) dedicated short range communications (DSRC), a 5.9 GHz band dedicated to 10 m to 300 m bidirectional, private and secure communications. This channel can be used for all V2I communications. For example, initial hand shaking between the base grid connected power converter and the vehicle can be first performed. The initial hand shaking can take the form of the grid side WPT system assisting in vehicle alignment by interacting through a vehicle parking aid for instance. Subsequently, the system can ensure that no obstacles or biologics are present in the active field zone before enabling the power transfer.

Regarding the power flow regulation, the status signal can be derived from the vehicle on-board battery (RESS), and can become available over the vehicle CAN from the BMS. The status signal can include messages for temperature, SOC, SOH, and a command for inhibiting charging. The feedback signals can include, for example, an enable/inhibit WPT signal, the power rate parameters (such as charge rate $P_{chg}$ and the grid converter duty ratio d*), the frequency offset (f*), and any information associated with charging from multiple pad units such as may be found in a parking structure.

Thus, signals between the grid charger and vehicle can positively identify the vehicle as being parked above transmit pad k of N, where N is the number of individual pads capable of being energized at maximum power from a single grid converter. For the case of on-road dynamic charging this same signal will be used to sequence and energize small groups of embedded transmit coils, for example, 3 at a time out of dozens along a stretch of highway all driven by a single, high power grid converter.

Figure 5:
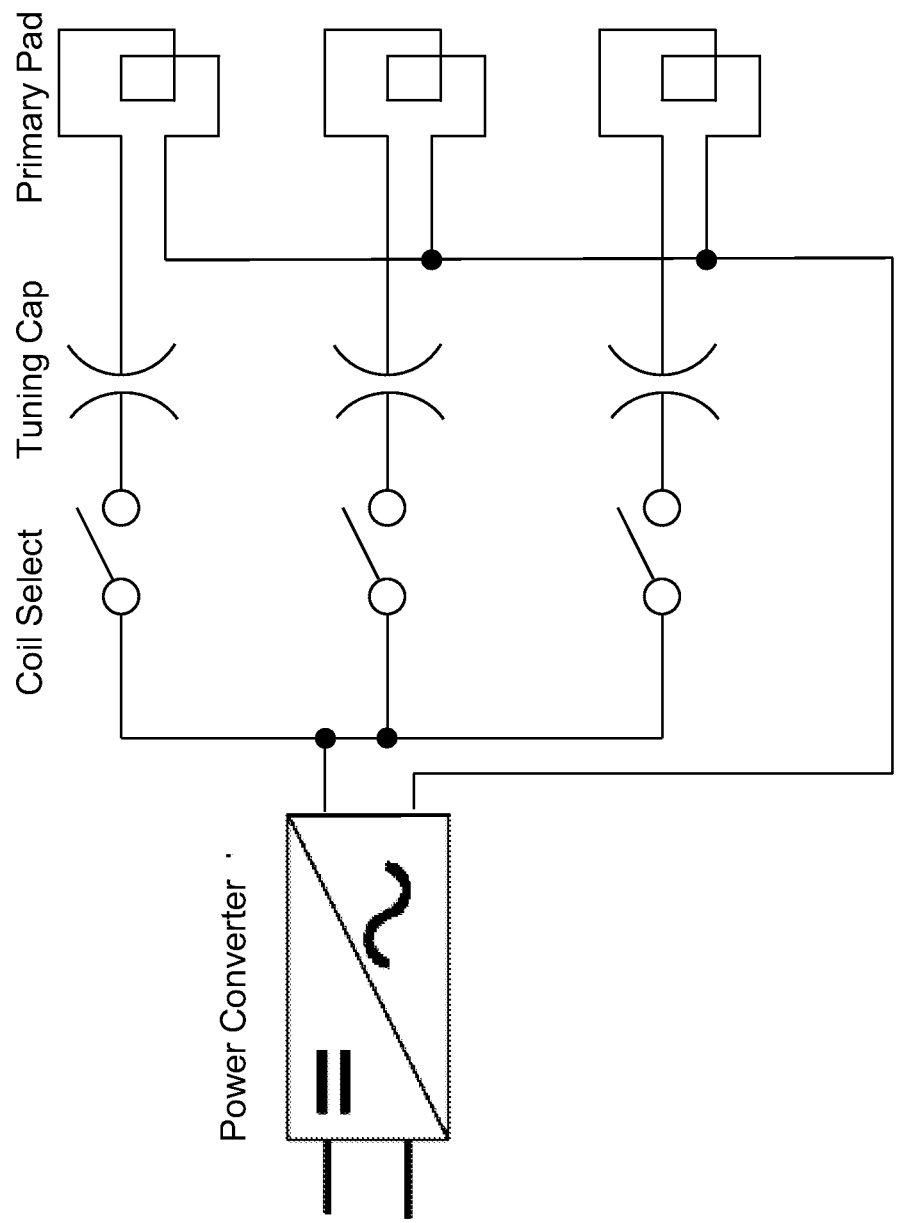
FIG. 5 is a schematic illustrating of the grid side of a wireless power transfer system in a configuration in which a plurality of primary circuits are present according to an embodiment of the present disclosure.

Referring to FIG. 5, a schematic for a charging station is shown, which can be employed for residential, stationary charging and public parking structure parking. A single grid charger is connected to a pair of transmit pads. In general these transmit pads will be individually energized by the power converter via dedicated switchgear and tuning capacitor modules. A vehicle parked above one transmit pad (primary pad) in a parking structure can cause only the pad that the vehicle is parked on energized, while not energizing any other transmit pad in the adjacent parking spaces where occupants can be standing while unloading the vehicle. Each transmit pad is tuned with a separate high voltage and high current ac capacitor.

In an exemplary evanescent wave power transfer demonstrator employed in the course of the research leading to the present disclosure, the tuning capacitors were 600 V high current induction heating units. A higher DC input voltage can also be employed. For example at 300 $V_{dc}$, the coupling coil and capacitor voltages can ring up to 2 kV and higher depending on the frequency and the loading.

Figure 6:
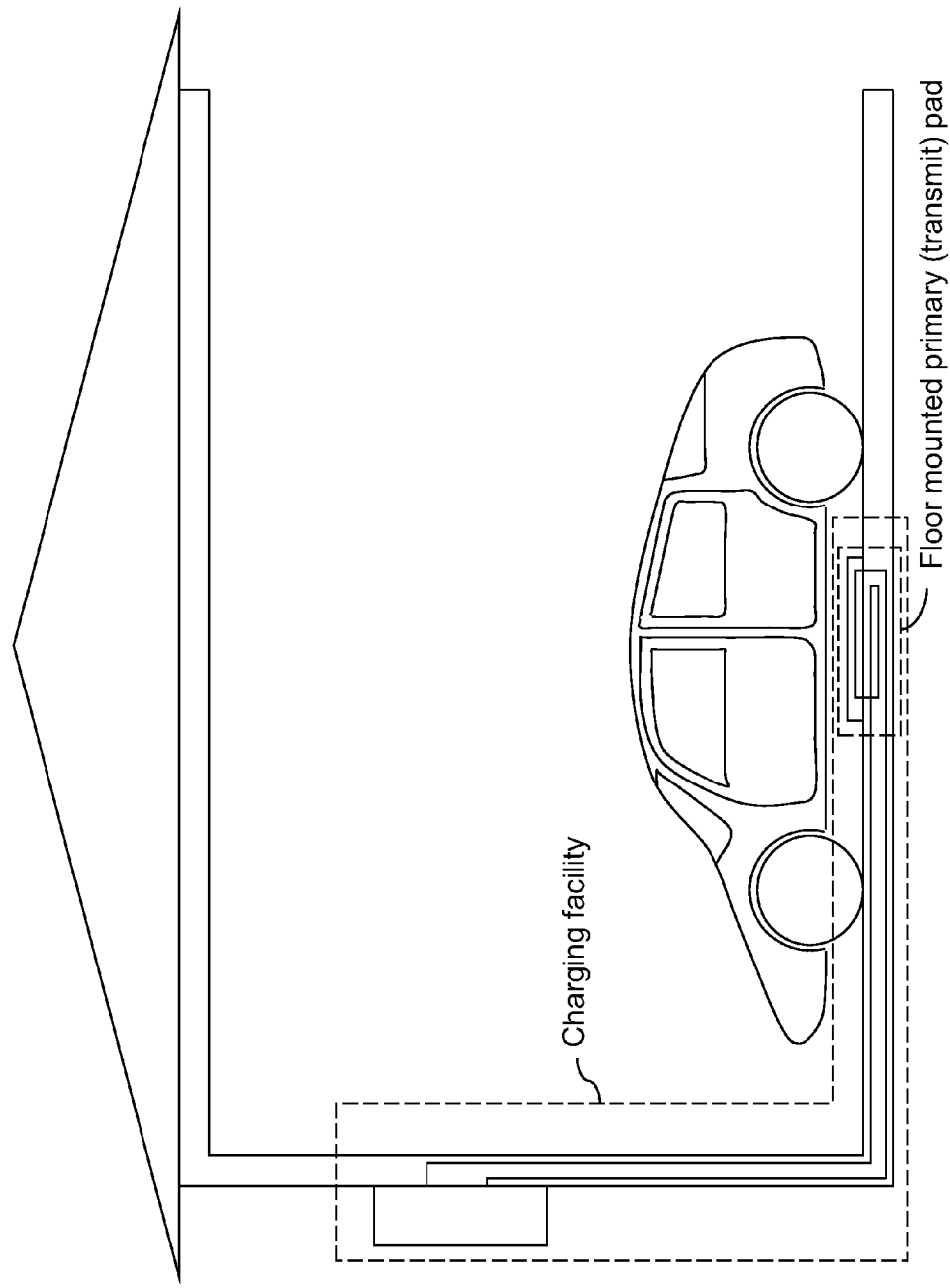
FIG. 6 is a schematic diagram of an exemplary charging facility, which is an installation of a charging station, and a vehicle in a charging position.

Referring to FIG. 6, an exemplary charging facility, which is an installation of a charging station in a residential garage, is shown in a picture. The exemplary installation can employ the same circuit as the circuit shown in FIG. 5. A rectangular charging pad installed on a planar bottom surface of the garage is shown. The number of charging pads (i.e., the primary pads of FIG. 5) can be adjusted depending on the size of the garage and the number of vehicles in the household.

Figure 7:
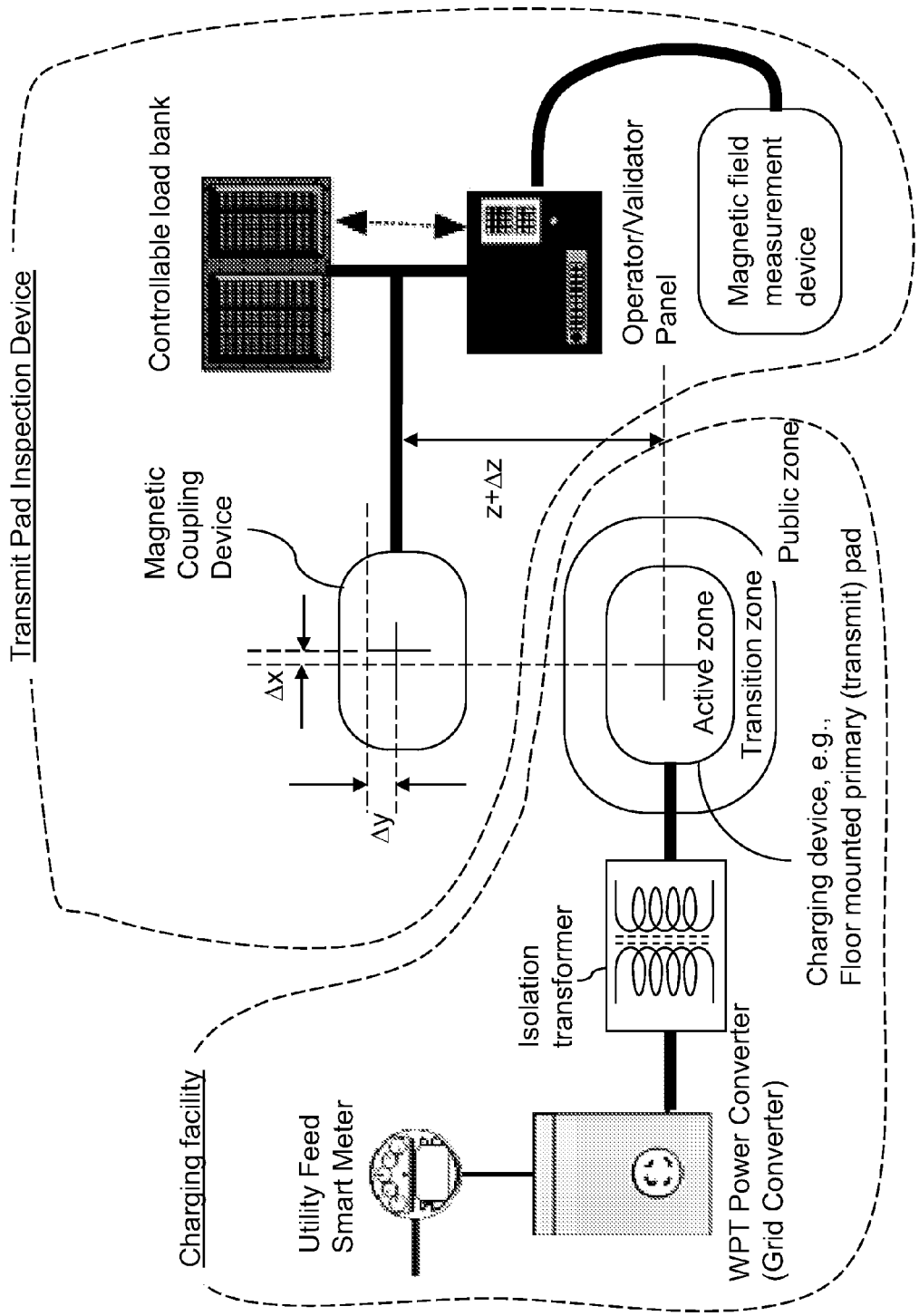
FIG. 7 is a diagram illustrating a transmit pad inspection device and a charging facility according to an embodiment of the present disclosure.

Referring to FIG. 7, a diagram illustrates a transmit pad inspection device and a charging facility according to an embodiment of the present disclosure. The transmit pad inspection device can be employed to validate the installation of various devices at the charging facility. For example, the transmit pad inspection device can be employed by a municipal electrical inspector to confirm that a contracting electrician has properly installed the wireless charging electric vehicle support equipment (EVSE) including the charging device for the charging facility.

The input nodes of a wireless power transfer (WPT) power converter are connected to a utility metering unit. The utility metering unit can be, for example, a utility feed smart meter configured to measure the input power to the WPT power converter and to transmit the information on the power usage to other devices by wireless communication. The WPT power converter can be a grid converter. The output nodes of the WPT power converter are connected to charging device, which can be a WPT transmit pad. The utility metering unit, the WPT power converter, and the charging device collectively constitute the charging facility, which is a wireless power transfer electric vehicle support equipment (WPT EVSE).

In one embodiment, the output nodes of the WPT power converter can be optionally connected to the charging device through an isolation transformer, which can be a high frequency isolation transformer configured to provide high efficiency inductive coupling at the operational frequency of the WPT power converter, i.e., at the output frequency of the WPT power converter. Thus, the WPT power converter may be directly connected to the primary capacitor and the primary coil located in the primary pad, or can be indirectly connected to the primary capacitor and the primary coil through the isolation transformer. The presence of an isolation transformer can provide enhanced safety of the charging facility by inherently making the primary pad safer in case the conductors within the primary coil or any other conductor material within the primary pad is cut or touched. Further, the utility feed can be protected from unexpected electrical shorting within the primary pad. The turns ratio of the isolation transformer may be 1.0, or may be a number different from 1.0.

An inspector in charge of inspecting the installation of the charging facility, e.g., a municipal electrical inspector, can employ the transmit pad inspection device to validate, or to detect any deficiency in, the various devices of the charging facility. Particularly, the inspector can use the transmit pad inspection tool of the present disclosure to validate the installation and to verify that the installation meets international standards for WPT PEV charging.

In one embodiment, the transmit pad inspection device can include an inductive coil within a magnetic coupling device. The inductive coil can be an industry standard Level 2 receiver coil. For example, the industry standard Level 2 receiver coil can be the same as an inductive coil manufactured by an original equipment manufacturer (OEM) and mounted to a vehicle as a part of a WPT charging circuit. The inductive coil functions as a capture coil, and can confirmed to SAE recommended size, impedance, and other parameters that are significant for functionality as the capture coil. The inductive coil of the magnetic coupling device can be connected to a controllable load bank and operator panel. The operator panel can be a portable programmable logic controller (PLC) with a human-machine interface (HMI) display.

During validation of the installation of the charging facility, the proper frequency setting of the transmit coil, which functions as the primary coil of the WPT, within the charging device can be confirmed. The nominal frequency of the WPT operation can be in a range from 10 kHz to 200 kHz. The frequency of the output of the WPT power converter can be measured either by current measurement within the magnetic coupling device or by employing a device configured to measure the frequency of the magnetic field generated by the charging device. The measurement of the frequency of the output of the WPT power converter can be repeated for various loading conditions, which can be selected with the controllable load bank. The response time of the receiver coil, i.e., the inductive coil within the magnetic coupling device, to load changes can be monitored.

The coupling power of the WPT system can be confirmed at specified setting of the gap between the charging device (e.g., the primary pad) and the receiver coil (the inductive coil) in the magnetic coupling device during validation of the installation of the charging facility. For example, the specified settings of the gap can include 150 mm, 200 mm, and 250 mm. In one embodiment, the magnetic coupling device can include a portable stand and adjustable legs that allow change of distance between the receiver coil and the bottom surfaces of the adjustable legs, which can be placed on the surface of the charging device. The adjustable legs can have predefined length settings in order to facilitate testing at the specified distances between the receiver coil and the charging device, i.e., the surface of the transmit pad. In one embodiment, the emission level of the magnetic field in the transition zone and the public zone can be measured at each setting of the specified distances to verify that the emissions level is within the specification for charging facilities.

The power level (rating) of the WPT facility can be confirmed during validation of the installation of the charging facility. Specifically, the power level of the utility feed smart meter, the WPT power converter, and the charging device can be confirmed. For example, the power level of the WPT equipment in the charging facility can be nominally Level 2 at 3.3 kW or 6.6 kW.

The grid converter to receiver capture coil efficiency can be measured, recorded, and/or validated during validation of the installation of the charging facility. The specification for the grid converter to receiver capture coil efficiency can be, for example, a percentage between 85% and 90%. If the power level of the WPT equipment in the charging facility is 3.3 kW, the power dissipated in the controllable load bank can be greater than 2.85 kW or 3.0 kW. If the power level of the WPT equipment in the charging facility is 6.6 kW, the power dissipated in the controllable load bank can be greater than 5.7 kW or 6.0 kW.

The grid connected WPT power converter can be operated by a command issued by the transmit pad inspection device and transmitted to the charging facility employing a standardized communication protocol (such as IEEE 802.11p DSRC or IEEE 802.11.15 zigbee) during validation of the installation of the charging facility. The command can be issued, for example, manually employing the operator/validator panel, or automatically as a part of an automated program that runs on the operator/validator panel.

The command can cause several seconds of rated power to be applied to the controllable load bank at an optimal lateral alignment at which the x-direction lateral offset $\Delta x$ and the y-direction lateral offset $\Delta y$ are zero. As used herein, the z-direction refers to the direction that is perpendicular to the plane including the planar outer surface of the charging device (e.g., the transmit pad), or if the surface of the charging device is non-planar, refers to the direction that is perpendicular to a planar plane to which the charging device is affixed and from which a non-planar surface of the charging device protrudes or is recessed. The x-direction and the y-direction refer to the two orthogonal directions within a plane including a planar outer surface of the charging device (e.g., the transmit pad).

Additionally, after placing the magnetic coupling device with at least one non-zero lateral offset (i.e., after setting at least one of the x-direction lateral offset $\Delta x$ and the y-direction lateral offset $\Delta y$ at a non-zero value) relative to the charging device, another command can be issued from the operator/validator panel to cause several seconds of rated power to be applied to the controllable load bank with the at least one non-zero lateral offset. The grid connected WPT power converter can be converted at each misalignment offset conditions between the magnetic coupling device and the charging device. The maximum alignment offset can be, for example, +/−100 mm for each of the x-direction lateral offset $\Delta x$ and the y-direction lateral offset $\Delta y$. The transmit pad inspection device can be employed to validate that power transfer is within manufacturer ratings for each of the misalignment offset conditions. In one embodiment, the controllable load bank can be provided with a cooling fan to insure the selected load is not substantially influenced by temperature during testing.

A magnetic field measurement device, such as a Gauss meter, can be employed to measure the frequency and the magnitude of the magnetic field within the active zone, the transition zone, and the public zone. The WPT power converter can be set to a rated power transfer setting, and the load setting of the controllable load bank can be controlled by dedicated short range communications (DSRC). The magnetic field can be measured, for example, at the boundary between the transition zone and the public zone. In one embodiment, the boundary between the transition zone and the public zone can be laterally offset from the active area of the transmit pad by about 300 mm. The magnetic field measurement device can be employed to validate the magnitude of the magnetic field does not exceed a predefined safety limit. For example, the predefined safety limit can be that the magnitude of the magnetic field that does not exceed 62.5 mG (6.25 uT) in all regions of the public zone. In one embodiment, a cooling fan can be employed to ensure adequate power dissipation from the controlled load.

During validation of the installation of the charging facility, the ability of the charging facility to shut off the power applied to the charging device in case of an emergency can be tested. In this case, the ability to inhibit and to re-enable the WPT power converter from the operator panel of the transmit pad inspection device can be tested. Inhibit time (i.e., the time delay between issuance of the inhibit command from the operator panel and the actual shutting off of the power applied to the charging device), including DSRC latency, should be less than 20 ms, or some other agreed-upon specification.

According to an embodiment of the present disclosure, a transmit pad inspection device includes a magnetic coupling device and a controllable load bank. The magnetic coupling device includes an inductive circuit that is configured to magnetically couple to a primary circuit of a charging device in a transmit pad as a secondary circuit through an alternating current (AC) magnetic field. The controllable load bank is connected to the magnetic coupling device. The transmit pad inspection device further includes a means for determining an input power applied to the primary circuit through communication with a device configured to measure the input power. In addition, the transmit pad inspection device includes a means for determining an output power delivered to a load in the controllable load bank.

The transmit pad inspection device can be employed to inspect a transmit pad for wireless power transfer. The magnetic coupling device is positioned in a vicinity of a transmit pad of a charging device that includes a primary circuit. The vicinity is selected to magnetically couple the inductive circuit to the primary circuit through an alternating current (AC) magnetic field generated by the primary circuit. The input power applied to the primary circuit is determined, and the output power delivered to a load in the controllable load bank is determined.

In one embodiment, the transmit pad inspection device can be configured to be in communication with the device configured to measure the input power. To determine the input power, information on the input power can be transmitted from a device wired to the primary circuit and configured to measure the input power to the transmit pad inspection device. The device configured to measure the input power can be, for example, a utility feed smart meter connected to the primary circuit of the charging device.

In one embodiment, the transmit pad inspection device can further include a means for determining the efficiency of power transfer under at least one coupling condition between the primary circuit and the inductive circuit. The means for determining the efficiency can be configured to generate the efficiency by dividing the output power by the input power, and can be, for example, a calculator built into the operator panel. Thus, the efficiency of power transfer can be determined by dividing the output power by the input power.

In one embodiment, the magnetic coupling device can further include a rectification circuit electrically connected to the inductive circuit, which is located within the magnetic coupling device. The rectification circuit is connected to the controllable load bank. The inductive circuit can include an inductive coil and a capacitor. The inductive coil can be connected to a parallel connection of the capacitor and the rectification circuit. The controllable load bank can be configured to connect a selected load among a plurality of loads to an output node of the rectification circuit. The plurality of loads, can be, for example, a plurality of resistive loads, which emulate various conditions of a battery in an RESS.

In one embodiment, the transmit pad inspection device can further include a magnetic field measurement device configured to measure the magnitude of a residual magnetic field in a transition zone and a public zone of the charging device. Thus, the magnitude of a residual magnetic field can be measured in the transition zone and the public zone of the charging device employing the magnetic field measurement device. Additionally or alternately, the magnetic field measurement device can be configured to measure at least a frequency of a magnetic field generated by the charging device.

The transmit pad inspection device can further include a means to determine a time delay between a first time point at which a load within the controllable load bank is changed and a second time point at which the frequency of the magnetic field stabilizes after the change in the load. Thus, the time delay can be measured between a first time point at which a load within the controllable load bank is changed and a second time point at which the frequency of the magnetic field stabilizes after the change in the load.

The transmit pad inspection device can further include a means for varying a spacing between the charging device and the magnetic coupling device. For example, the transmit pad inspection device can have a set of adjustable legs that can provide a variable distance between the magnetic coupling device and the charging device. The spacing between the charging device and the magnetic coupling device can be changed employing the means for varying the spacing. The input power applied to the primary circuit after the changing of the spacing can be subsequently determined. Further, the output power delivered to a load in the controllable load bank after the changing of the spacing can be determined.

The transmit pad inspection device can further include a device configured to induce ventilation within the controllable load bank. The device configured to induce ventilation can be, for example, a fan, and can be employed to maintain the temperature of the loads in the controllable load bank.

The transmit pad inspection device can further include a means for transmitting a command for turning off the input power to the primary circuit. The transmit pad inspection device can be configured to monitor power delivered to the controllable load bank as a function of time after transmission of the command for turning off the input power to the primary circuit. A command can be transmitted for turning off the input power from the transmit pad inspection device to the primary circuit. Further, power delivered to the controllable load bank can be monitored as a function of time after transmission of the command for turning off the input power to the primary circuit.

The transmit pad inspection device can further include a communication means configured to transmit information on a value of a selected impedance of the controllable load bank to a device controlling the input power to the primary circuit. In addition, the transmit pad inspection device can include a magnetic field measurement device configured to measure at least a frequency of a magnetic field generated by the charging device. The transmit pad inspection device is configured to vary the output power by changing the selected impedance of the controllable load bank. Further, the transmit pad inspection device can be configured to determine a correlation between the output power and a frequency of the AC magnetic field as measured by the magnetic field measurement device for each setting for the selected impedance for the controllable load bank.

Figure 8:
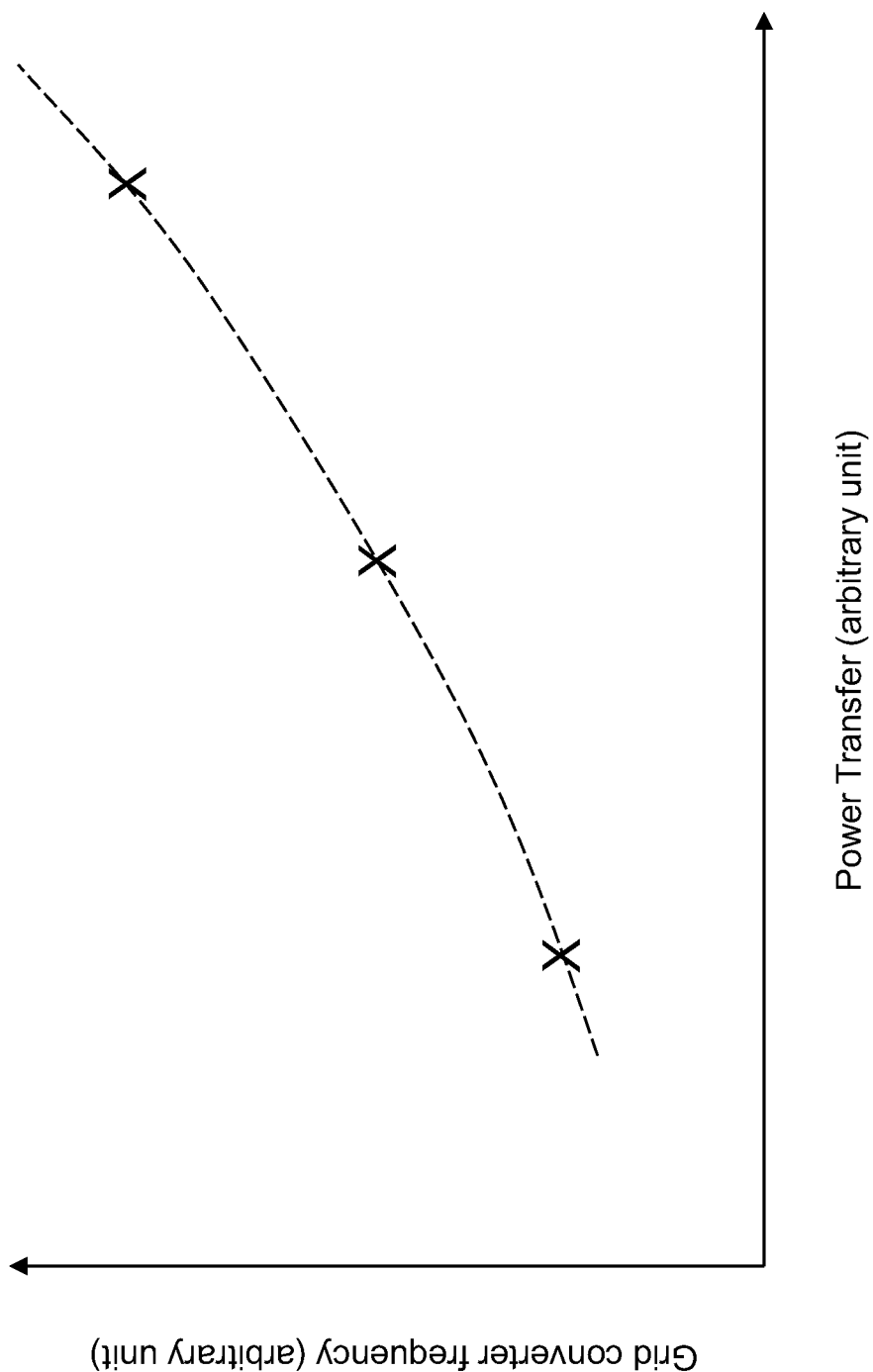
FIG. 8 is a graph schematically illustrating the correlation between the power transfer and the grid converter frequency according to an embodiment of the present disclosure.

Thus, information on a value of a selected impedance of the controllable load bank can be transmitted from the transmit pad inspection device to a device controlling the input power to the primary circuit. At least the frequency of the magnetic field generated by the charging device can be determined employing a magnetic field measurement device. The output power can be varied by changing the selected impedance of the controllable load bank. The correlation between the output power and the frequency of the AC magnetic field as measured by the magnetic field measurement device can be determined for each setting for the selected impedance for the controllable load bank. FIG. 8 illustrates an exemplary correlation between the output power and the frequency of the AC magnetic field.

The transmit pad inspection device can be configured to transmit instructions that set a frequency of a grid converter connected to the primary circuit. The transmit pad inspection device can be configured to determine a correlation between the output power and the frequency of a grid converter for each setting for a selected impedance of the controllable load bank. The transmit pad inspection device can further include a means for varying a spacing between the charging device and the magnetic coupling device. The transmit pad inspection device can also be configured to determine a correlation between the output power and the frequency of a grid converter for each setting for the spacing.

Figure 9:
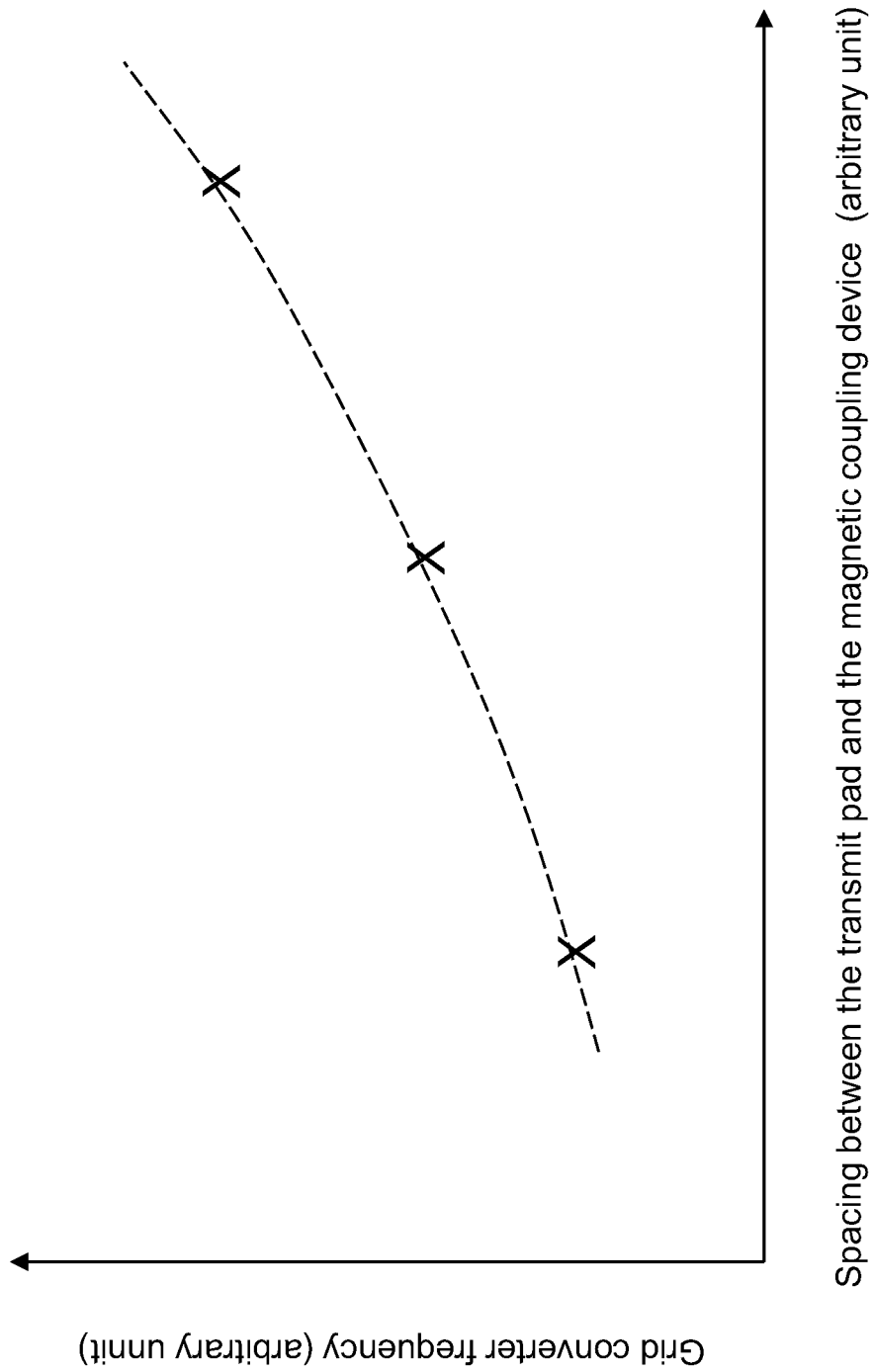
FIG. 9 is a graph schematically illustrating the correlation between the spacing between the transmit pad and the magnetic coupling device and the grid converter frequency according to an embodiment of the present disclosure.

Instructions that set a frequency of the grid converter can be transmitted from the transmit pad inspection device to the primary circuit. The correlation between the output power and the frequency of the grid converter can be determined for each setting for a selected impedance of the controllable load bank. Further, the spacing between the charging device and the magnetic coupling device can be changed. Subsequently, the correlation between the spacing and the frequency of a grid converter can be determined. FIG. 9 illustrates an exemplary correlation between the spacing and the frequency of a grid converter.

The viability of wireless power transfer, whether at SAE Level 2 (3 to 19 kW), or at high power (100 kW to >250 kW) as would be needed for an electric transit bus, comes down to the efficiency, size and cost of the coupling coils. The energy management strategy for WPT amounts to vehicle on-board monitoring of the ESS using the BMS and having these signals available on vehicle CAN bus. DSRC communications closes the loop on charging by feeding back the control signals to the grid side converter. The impact is fast, accurate and safe charging of the vehicle battery pack. Overall economics are determined by the benefits WPT brings to PEV charging, least of all convenience and in the future on-road dynamic charging.

In addition, there will be pressing need for installation inspection and validation of proper operation of WPT installed charging equipment. It is now known that not only are OEM's tending to Level 2 at 6.6 kW because of customer preference, but that customer EVSE installations for J1772 cable and plug chargers are not being activated because of overloaded municipal electrical inspectors and the novelty of the equipment being inspected for approval. The transmit pad inspection device of the present disclosure can facilitate the ease of such inspections.

The transmit pad inspection device can be employed as a WPT EVSE installation and validation tool to inspect the equipments in a charging facility, whether in a residential garage or public parking structure, according to municipal electrical code for residential and commercial installations. The transmit pad inspection device is operated to emulate a vehicle, and as such, is capable of controlling the operation of the charging facility to validate that the various devices in the charging facility satisfies the power level, control and communications requirements as well as safety and emissions requirements.

Figure 10A:
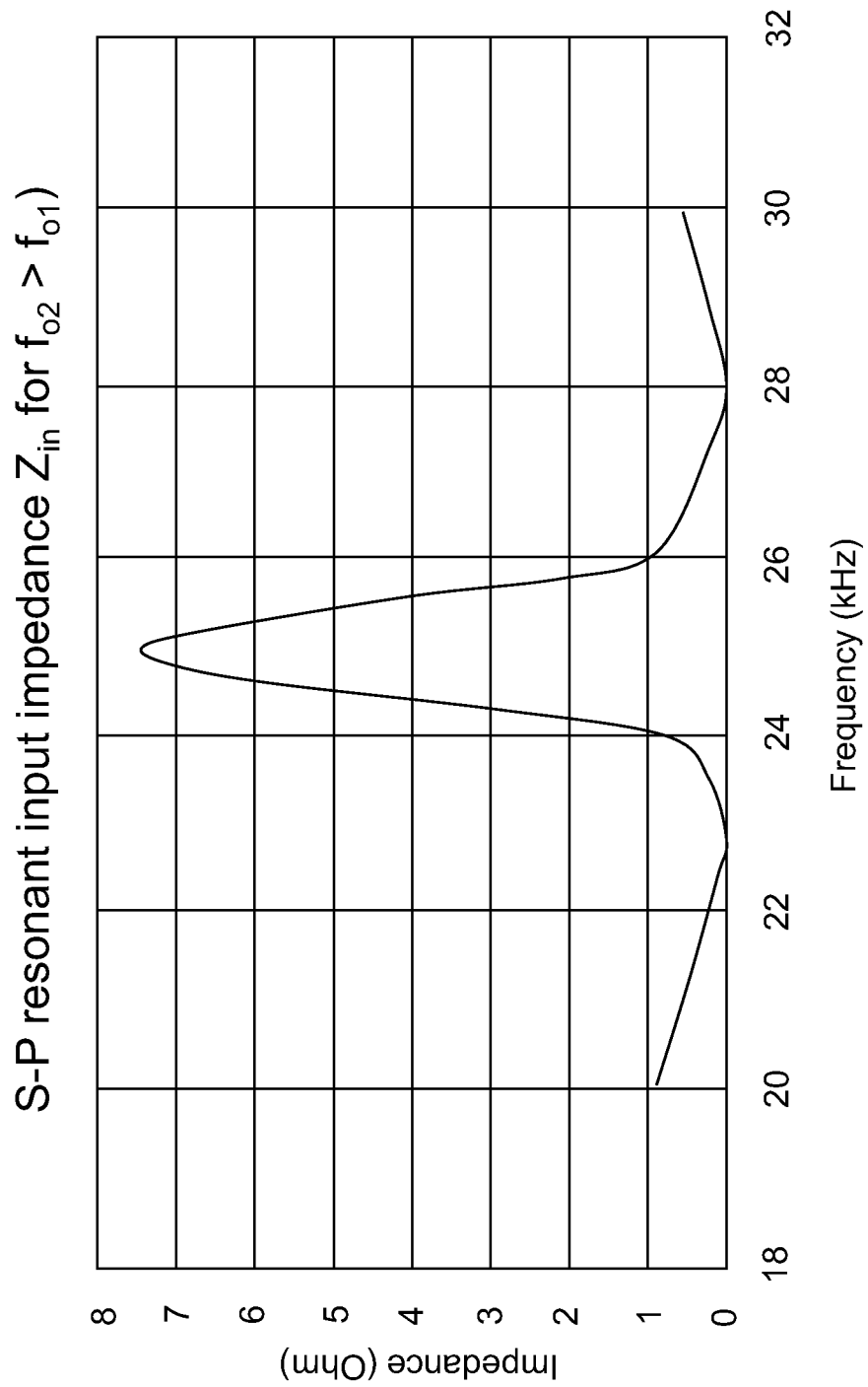
FIG. 10A is a graph illustrating the input impedance of the combination of the primary circuit and the secondary circuit for the case in which the second resonance frequency of the second circuit is greater than the first resonant frequency of the first circuit. The input impedance is obtained by adding the impedance of the primary circuit and the effect of the secondary circuit through coupling with the primary circuit via a set of coupling coils.
Figure 10B:
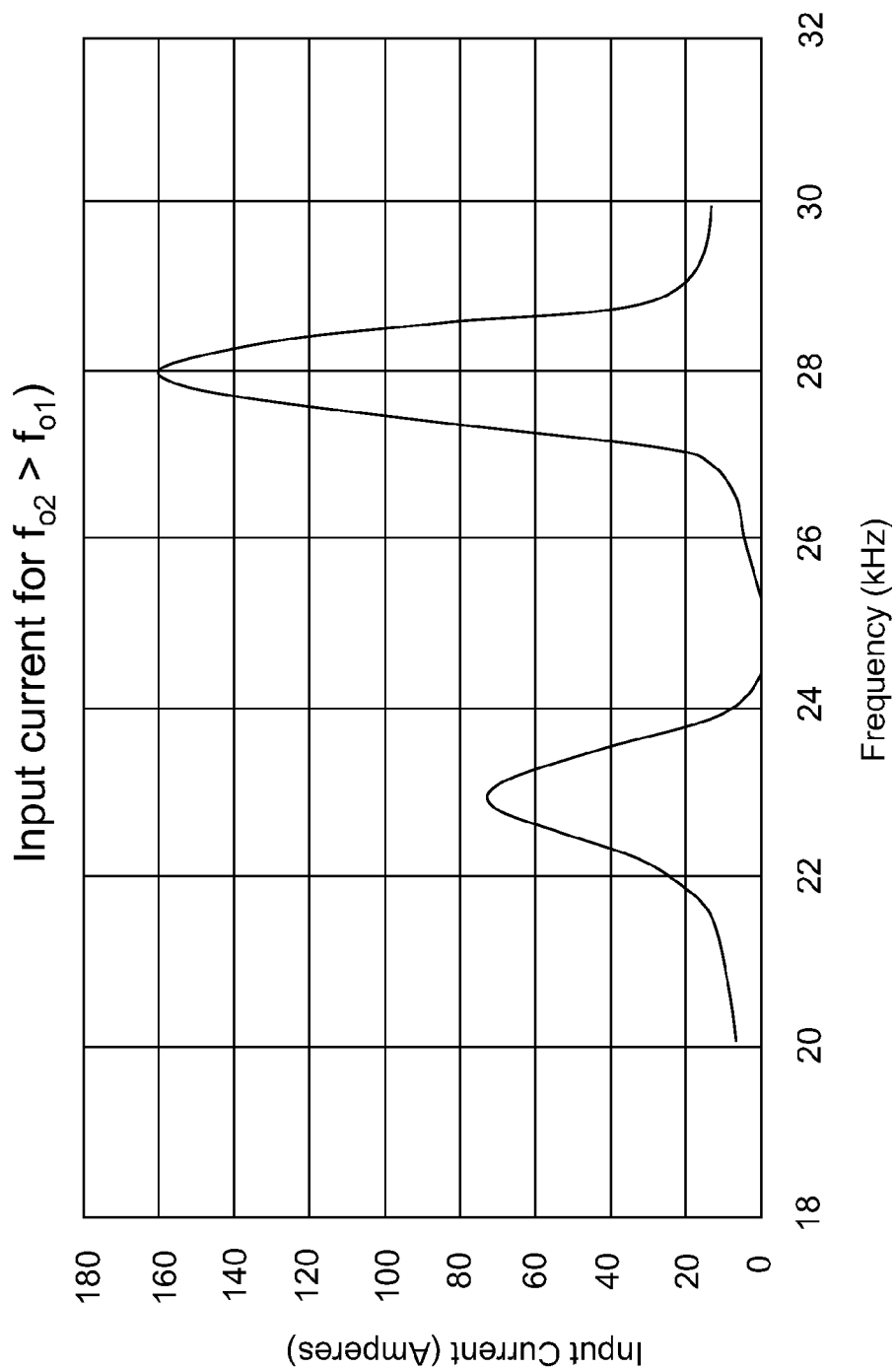
FIG. 10B is a graph illustrating the input current corresponding to the condition of FIG. 10A.

FIG. 10A shows the frequency dependence of the input impedance of the combination of the primary circuit and the secondary circuit for the case in which the second resonance frequency $f_{o2}$ of the second circuit is greater than the first resonant frequency $f_{o1}$ of the first circuit. The first circuit is the circuit of the charging facility in FIG. 7, and the second circuit is the circuit of the magnetic coupling device and the controllable load bank within the transmit pad inspection device of FIG. 7. The input impedance is obtained by adding the impedance of the primary circuit and the effect of the secondary circuit through coupling with the primary circuit via a set of coupling coils. FIG. 10B is a graph illustrating the input current corresponding to the condition of FIG. 10A.

In one embodiment, to accomplish the various conditions in which the second resonance frequency $f_{o2}$ of the second circuit is less than, equal to, or greater than, the first resonant frequency $f_{o1}$ of the first circuit, the controllable load bank can contain multiple capacitors that can be selectively added to the load within the controllable load bank. When a capacitor having a nominal value is selected and connected within the magnetic coupling device (or alternately, within the controllable load bank), the tuned frequency equality is maintained, i.e., the second resonance frequency $f_{o2}$ of the second circuit is equal to the first resonant frequency $f_{o1}$ of the first circuit. By selecting a capacitor having a greater or lesser capacitance, the second resonance frequency $f_{o2}$ of the second circuit can be less than, or greater than, the first resonant frequency $f_{o1}$ of the first circuit. In an exemplary illustration, in a WPT system having a primary inductance of 15.3 µH in the primary circuit and having a secondary inductance of 16.8 µH in the secondary circuit, the primary circuit can be tuned with an OEM capacitor having a capacitance of 2.69 µF. The secondary circuit including a portable receiver coil in the magnetic coupling device can be tuned by using a series of capacitance values, which can include, for example, a first capacitance of 2.385 µF, a second capacitance of 2.45 µF, and a third capacitance of 2.52 µF. The various values for the capacitance can be obtained, for example, by providing a capacitor having the capacitance of 2.385 µF and a series of additional capacitors that can be added to this capacitor in a parallel connection (e.g., 68 nF capacitors). The difference between the nominal frequency and the non-nominal frequencies of the second resonance frequency $f_{o2}$ can be approximately 350 Hz.

FIG. 10A and FIG. 10B show a no load response, i.e., a response when the resistance of the load within the controllable load bank is infinity, for the case in which the second resonance frequency $f_{o2}$ of the second circuit is greater than the first resonant frequency $f_{o1}$ of the first circuit. The input resonant current produces a corresponding voltage in the receiver coil. The input current should be zero at the resonance frequency, i.e., when the frequency f of the WPT power converter is equal to the first resonance frequency $f_{o1}$ of 24.8 kHz.

Figure 11A:
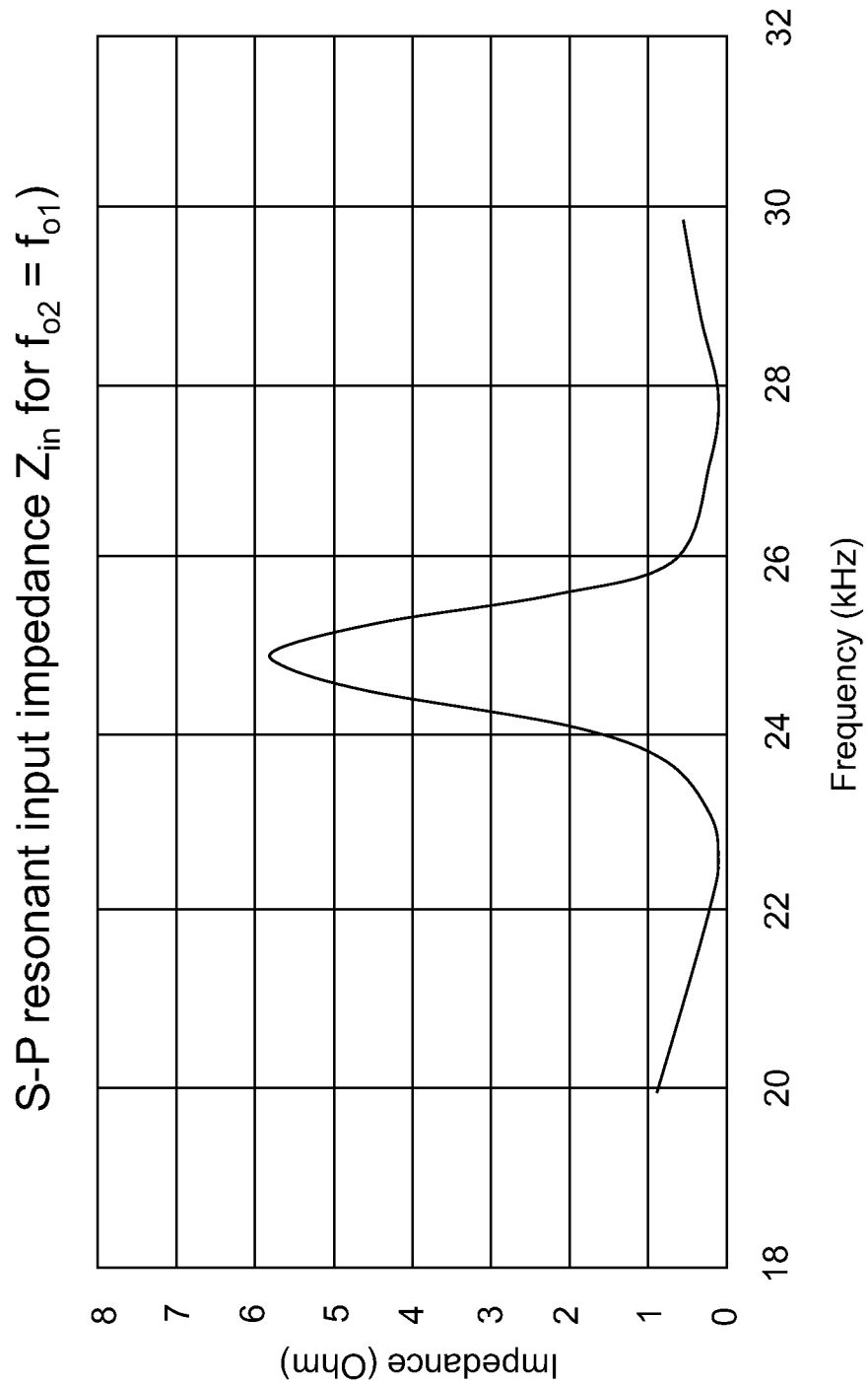
FIG. 11A is a graph illustrating the input impedance of the combination of the primary circuit and the secondary circuit for the case in which the second resonance frequency of the second circuit is equal to the first resonant frequency of the first circuit.
Figure 11B:
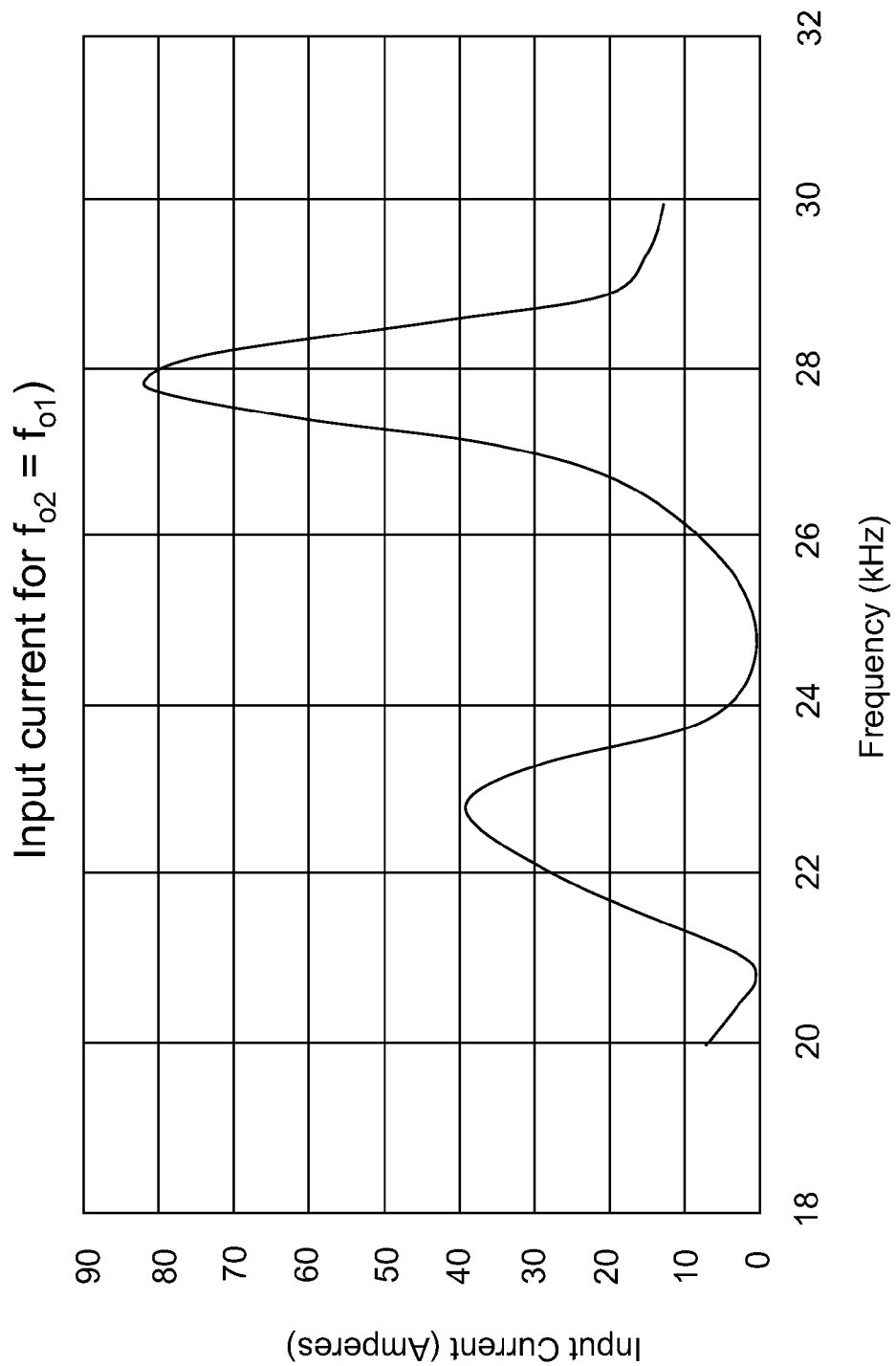
FIG. 11B is a graph illustrating the input current corresponding to the condition of FIG. 11A.

FIG. 11A and FIG. 11B show a no load response for the case in which the second resonance frequency $f_{o2}$ of the second circuit is equal to the first resonant frequency $f_{o1}$ of the first circuit. The input resonant current produces a corresponding voltage in the receiver coil. The input current should be close to zero at the resonance frequency, i.e., when the frequency f of the WPT power converter is equal to the first resonance frequency $f_{o1}$ of 24.8 kHz. However, the transmit pad current null width, i.e., the range of the frequency in which the input current illustrated in FIG. 11B is zero, is less than the corresponding transmit pad current null width of FIG. 10B.

Figure 12A:
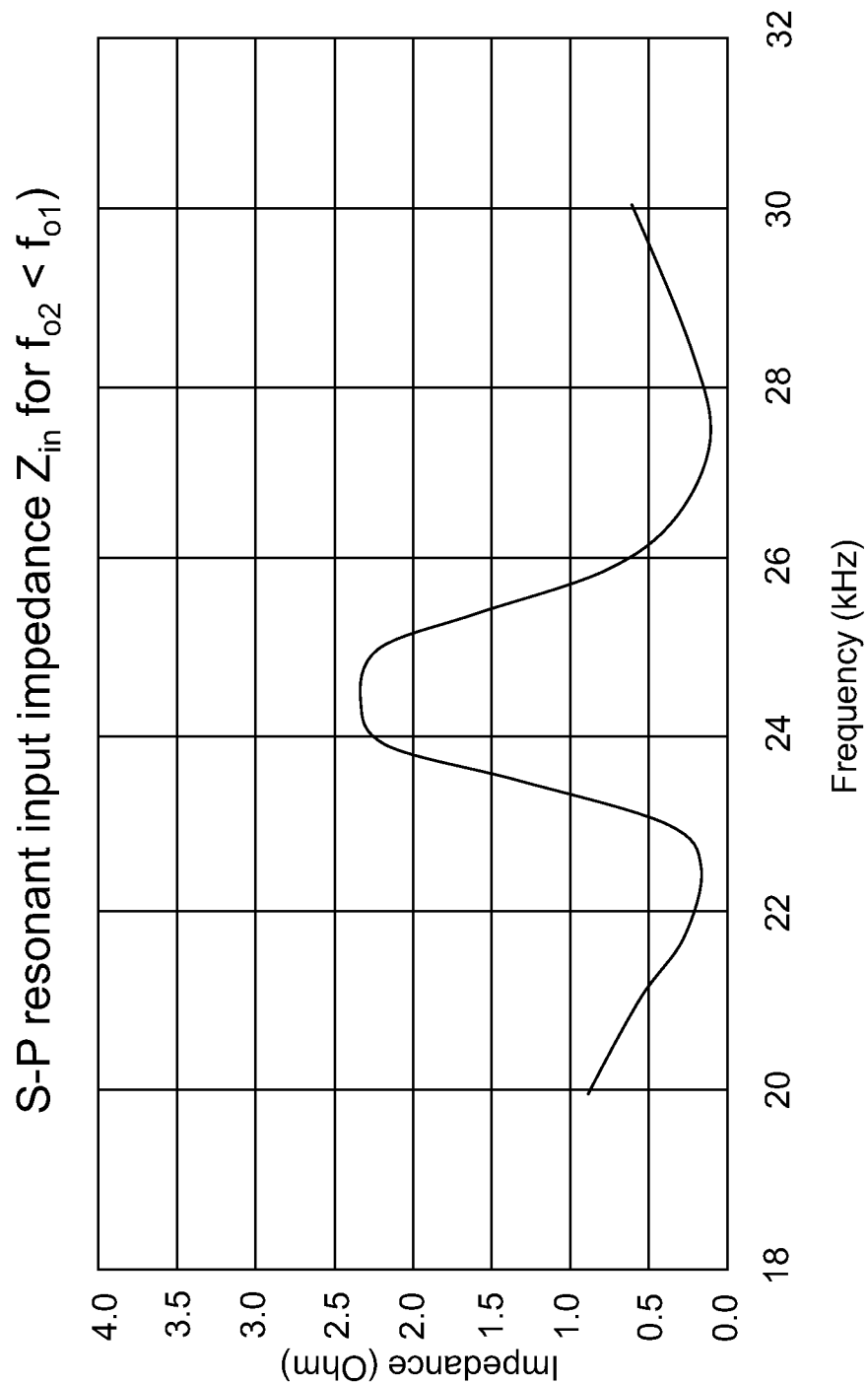
FIG. 12A is a graph illustrating the input impedance of the combination of the primary circuit and the secondary circuit for the case in which the second resonance frequency of the second circuit is less than the first resonant frequency of the first circuit.
Figure 12B:
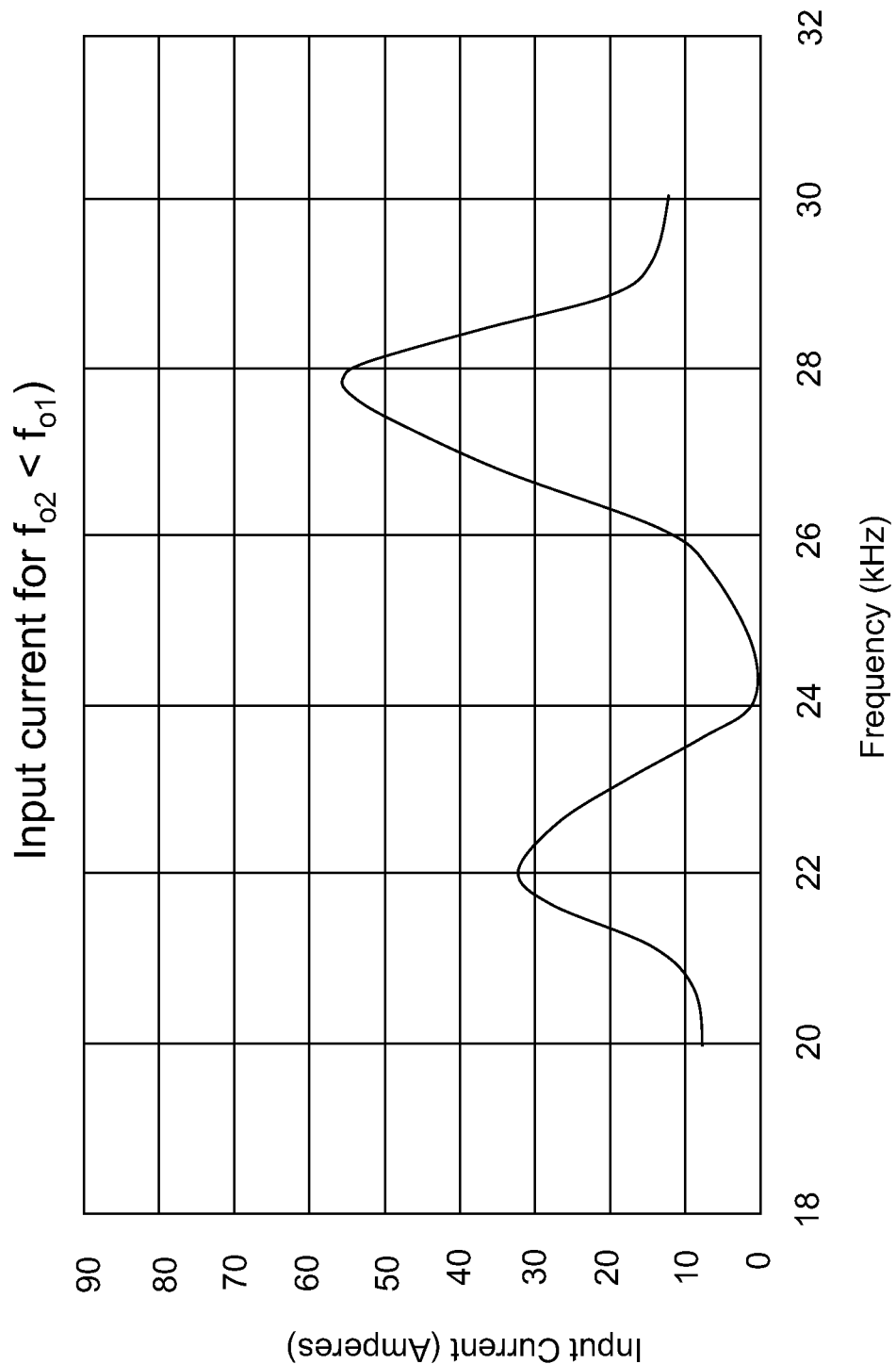
FIG. 12B is a graph illustrating the input current corresponding to the condition of FIG. 12A.

FIG. 12A and FIG. 12B show a no load response for the case in which the second resonance frequency $f_{o2}$ of the second circuit is less than the first resonant frequency $f_{o1}$ of the first circuit. The input resonant current produces a corresponding voltage in the receiver coil. The input current should be close to zero at the resonance frequency, i.e., when the frequency f of the WPT power converter is equal to the first resonance frequency $f_{o1}$ of 24.8 kHz. In FIG. 12B, however, the transmit pad current null width is less than the corresponding transmit pad current null width of FIG. 11B. Thus, the transmit pad current is easily detectable and current null width is narrow, which characterize this off resonance condition.

Thus, the transmit pad inspection device can be employed to verify that the receiver tuning drift does not cause any substantial increase in no load current as detected by the receiver coil as an open circuit voltage (i.e., the selected receiver load of the controllable load bank is infinity or a very high value resistance). The presence of magnetically permeable objects in the active field zone will detune the primary inductance and thereby cause a frequency shift that can indicate obstacle presence. Objects having permeability, such as biologics and children's toys will influence the primary capacitance and also detune the system. The transmit pad inspection device can be used to validate proper obstacle recognition and shutdown sequencing of the customer WPT.

Figure 13:
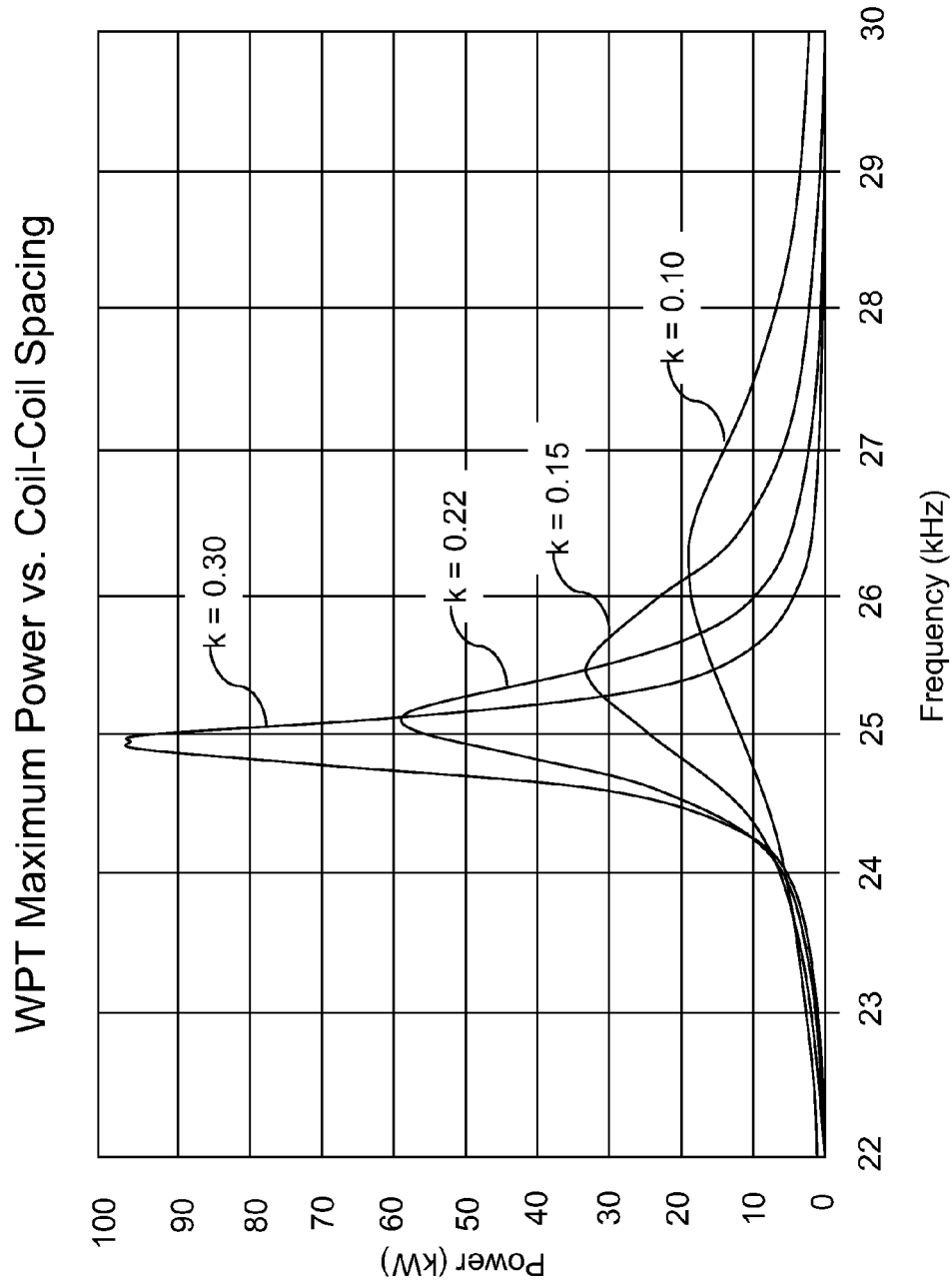
FIG. 13 is a graph illustrating the correlation between the frequency of the input signal and the transmitted power for various coupling constants according to an embodiment of the present disclosure.
Figure 14:
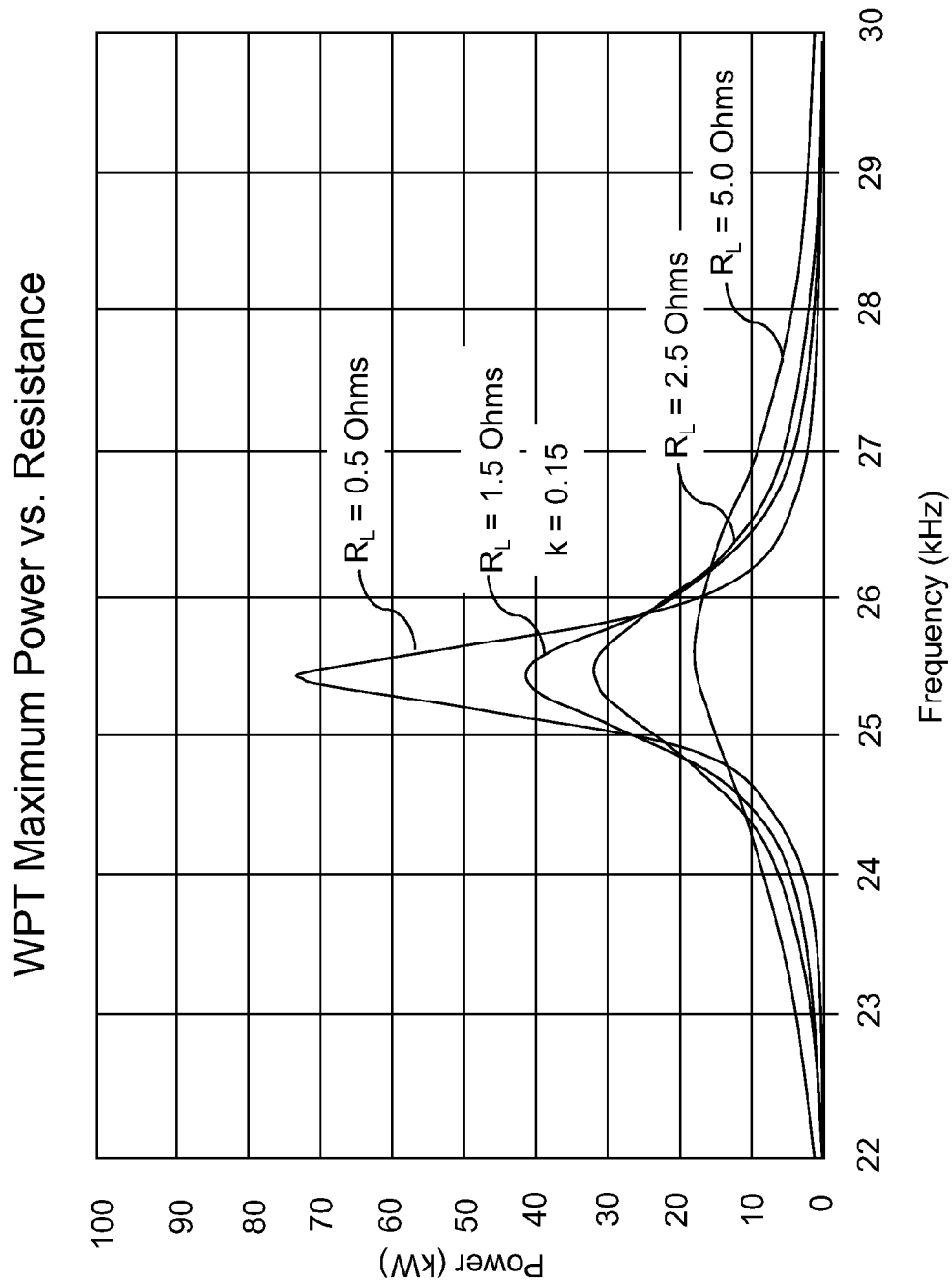
FIG. 14 is a graph illustrating the correlation between the frequency of the input signal and the transmitted power for various values of resistance of the load in the controllable load bank according to an embodiment of the present disclosure.

The transmit pad inspection device can be employed repeatedly under various coil-coil spacing conditions (i.e., various spacings between the transmit pad and the magnetic coupling device, and various rated load conditions with variable receiver coil tuning. Various correlations can be generated such as the correlation between the frequency of the input signal and the transmitted power for various coupling constants as illustrated in FIG. 13, and the correlation between the frequency of the input signal and the transmitted power for various values of resistance of the load in the controllable load bank as illustrated in FIG. 14.

While the invention has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Other suitable modifications and adaptations of a variety of conditions and parameters normally encountered in image processing, obvious to those skilled in the art, are within the scope of this invention. All publications, patents, and patent applications cited herein are incorporated by reference in their entirety for all purposes to the same extent as if each individual publication, patent, or patent application were specifically and individually indicated to be so incorporated by reference. Accordingly, the invention is intended to encompass all such alternatives, modifications and variations which fall within the scope and spirit of the invention and the following claims.

What is claimed is:

1. A transmit pad inspection device comprising:
   a magnetic coupling device including an inductive circuit that is configured to magnetically couple to a primary circuit of a charging device in a transmit pad as a secondary circuit through an alternating current (AC) magnetic field;
   a controllable load bank connected to said magnetic coupling device;
   the transmit pad inspection device configured to determine an input power applied to said primary circuit through communication with a device configured to measure said input power;
   the transmit pad inspection device configured to determine an output power delivered to a load in said controllable load bank,
   a magnetic field measurement device configured to measure at least a frequency of a magnetic field generated by said charging device,
   wherein the transmit pad inspection device is configured to vary said output power by changing a selected impedance of said controllable load bank, and to determine a correlation between said output power and a frequency of said AC magnetic field as measured by the magnetic field measurement device for each setting for the selected impedance for the controllable load bank.

2. The transmit pad inspection device of claim 1, wherein said device configured to measure said input power is a utility feed smart meter connected to said primary circuit of said charging device.

3. The transmit pad inspection device of claim 1, further comprising a programmable logic control configured to determine an efficiency of power transfer under at least one coupling condition between said primary circuit and said inductive circuit.

4. The transmit pad inspection device of claim 1, further comprising a magnetic field measurement device configured to measure a magnitude of a residual magnetic field in a transition zone and a public zone of said charging device.

5. The transmit pad inspection device of claim 1, further comprising:
   a magnetic field measurement device configured to measure at least a frequency of a magnetic field generated by said charging device; and
   programmable logic control configured to determine a time delay between a first time point at which a load within said controllable load bank is changed and a second time point at which said frequency of said magnetic field stabilizes after said change in said load.

6. The transmit pad inspection device of claim 1, further comprising a means for varying a spacing between said charging device and said magnetic coupling device.

7. The transmit pad inspection device of claim 1, further comprising programmable logic control configured for transmitting a command for turning off said input power to said primary circuit, wherein said transmit pad inspection device is configured to monitor power delivered to said controllable load bank as a function of time after transmission of said command for turning off said input power to said primary circuit.

8. The transmit pad inspection device of claim 1, further comprising:
 a communication means configured to transmit information on a value of the selected impedance of said controllable load bank to a device controlling said input power to said primary circuit.

9. The transmit pad inspection device of claim 1, wherein said transmit pad inspection device is configured to transmit instructions that set a frequency of a grid converter connected to said primary circuit, and wherein said transmit pad inspection device is configured to determine a correlation between said output power and said frequency of a grid converter for each setting for a selected impedance of said controllable load bank, and wherein said transmit pad inspection device further comprises a means for varying a spacing between said charging device and said magnetic coupling device, wherein said transmit pad inspection device is configured to determine a correlation between said spacing and said frequency of a grid converter.

10. A method of inspecting a transmit pad for wireless power transfer, said method comprising:
 providing a transmit pad inspection device comprising a magnetic coupling device including an inductive circuit and a controllable load bank connected to said magnetic coupling device;
 positioning said magnetic coupling device in a vicinity of a transmit pad of a charging device that includes a primary circuit, wherein said vicinity is selected to magnetically couple said inductive circuit to said primary circuit through an alternating current (AC) magnetic field generated by said primary circuit;
 determining an input power applied to said primary circuit;
 determining an output power delivered to a load in said controllable load bank;
 transmitting instructions that set a frequency of a grid converter from said transmit pad inspection device to said primary circuit;
 determining a correlation between said output power and said frequency of a grid converter for each setting for a selected impedance of said controllable load bank;
 changing a spacing between said charging device and said magnetic coupling device; and
 determining a correlation between said spacing and said frequency of a grid converter.

11. The method of claim 10, wherein said determining of said input power comprises transmitting information on said input power from a device wired to said primary circuit and configured to measure said input power to said transmit pad inspection device, and wherein said device wired to said primary circuit and configured to measure said input power is a utility feed smart meter connected to said primary circuit of said charging device.

12. The method of claim 10, further comprising determining an efficiency of power transfer under at least one coupling condition between said primary circuit and said inductive circuit.

13. The method of claim 10, further comprising measuring a magnitude of a residual magnetic field in a transition zone and a public zone of said charging device employing a magnetic field measurement device.

14. The method of claim 10, further comprising:
 measuring at least a frequency of a magnetic field generated by said charging device employing a magnetic field measurement device; and
 determining a time delay between a first time point at which a load within said controllable load bank is changed and a second time point at which said frequency of said magnetic field stabilizes after said change in said load.

15. The method of claim 10, further comprising:
 changing a spacing between said charging device and said magnetic coupling device;
 determining another input power applied to said primary circuit after said changing of said spacing; and
 determining another output power delivered to a load in said controllable load bank after said changing of said spacing.

16. The method of claim 10, further comprising:
 transmitting a command for turning off said input power from said transmit pad inspection device to said primary circuit; and
 monitoring power delivered to said controllable load bank as a function of time after transmission of said command for turning off said input power to said primary circuit.

17. The method of claim 10, further comprising:
 transmitting information on a value of a selected impedance of said controllable load bank from said transmit pad inspection device to a device controlling said input power to said primary circuit; and
 measuring at least a frequency of a magnetic field generated by said charging device employing a magnetic field measurement device.

18. The method of claim 17, further comprising:
 varying said output power by changing said selected impedance of said controllable load bank; and
 determining a correlation between said output power and a frequency of said AC magnetic field as measured by said magnetic field measurement device for each setting for said selected impedance for said controllable load bank.

\* \* \* \* \*